(12) United States Patent
Hirama

(10) Patent No.: US 10,782,329 B2
(45) Date of Patent: Sep. 22, 2020

(54) PHASE ANALYSIS CIRCUIT

(71) Applicant: MARCdevices Co., Ltd., Hiratsuka-shi, Kanagawa (JP)

(72) Inventor: Koichi Hirama, Hiratsuka (JP)

(73) Assignee: MARCDEVICES CO., LTD., Hiratsuka-Shi, Kanagawa (JP)

( * ) Notice: Subject to any disclaimer, the term of this patent is extended or adjusted under 35 U.S.C. 154(b) by 3 days.

(21) Appl. No.: 15/765,556

(22) PCT Filed: Sep. 27, 2017

(86) PCT No.: PCT/JP2017/034927
§ 371 (c)(1),
(2) Date: Feb. 4, 2019

(87) PCT Pub. No.: WO2019/064368
PCT Pub. Date: Apr. 4, 2019

(65) Prior Publication Data
US 2019/0154742 A1  May 23, 2019

(51) Int. Cl.
*G01R 25/00* (2006.01)
*H04L 27/00* (2006.01)

(52) U.S. Cl.
CPC ............ *G01R 25/005* (2013.01); *H04L 27/00* (2013.01)

(58) Field of Classification Search
CPC ....... H03L 7/0814; H03L 7/085; H03L 7/091; H03L 2207/50; H03L 7/081; H03L 7/107;
(Continued)

(56) References Cited

U.S. PATENT DOCUMENTS 4,334,312 A * 6/1982 Yoshida ............. H04L 27/3818
329/325
5,812,508 A * 9/1998 Moon .................... G11B 7/005
369/59.22

(Continued)

FOREIGN PATENT DOCUMENTS

JP 2000-151731 A 5/2000
JP 2006-311056 A 11/2006
JP 2016-151424 A 8/2016

OTHER PUBLICATIONS

Suminori Nishie and Masato Akagi, "Acoustic Sound Source Tracking for a Moving Object Using Precise Doppler-Shift Measurement", EUSIPCO 2013 1569746251, Sep. 2013, Morocco.

*Primary Examiner* — Vinh P Nguyen
(74) *Attorney, Agent, or Firm* — Procopio, Cory, Hargreaves & Savitch LLP

(57) ABSTRACT

A parallel phase shift circuit is configured to perform a phase shift process in parallel on an input signal pair including a first I signal orthogonal to a first Q signal, in accordance with a phase difference among a set of n multi-phase separation frequency signal pairs including a set of second I signals orthogonal to a set of second Q signals, to generate a set of n phase-shifted orthogonal signal pairs including a set of third I signals orthogonal to a set of third Q signals; and a phase discrete continuous measurement circuit configured to, based on the n phase-shifted orthogonal signal pairs from the parallel phase shift circuit, generate a set of discrete signals being n discrete values and generate a set of continuous tangent signals being a set of a desired number of signals interpolating the set of discrete signals.

11 Claims, 23 Drawing Sheets

(58) Field of Classification Search
CPC ....... H03L 7/191; H03L 7/193; H03L 7/1974;
H03L 7/1976; H03L 7/00; H03L 7/0994;
H03L 7/16; H03M 1/0836; H03M 3/38;
H03M 9/00; H03M 1/662; G01C 21/20;
G01D 5/35306; G01R 25/005; G01R
25/02; G06K 19/0723; H04W 40/02;
H04W 40/08; H04W 40/10; H04W 40/12;
H04W 40/24; H04W 40/246; H04W
40/248; H04W 40/30; H04W 52/0216;
H04W 52/0219; H04W 56/00; H04W
72/12; H04W 74/08; H04W 74/0816;
H04W 84/18
See application file for complete search history.

(56) References Cited

U.S. PATENT DOCUMENTS

| | | | | |
|---|---|---|---|---|
| 6,330,034 | B1* | 12/2001 | Renner | H03L 7/087 |
| | | | | 348/505 |
| 9,368,130 | B2* | 6/2016 | Jin | G11B 5/012 |
| 9,843,334 | B2* | 12/2017 | Weberg | H03L 7/081 |
| 2019/0154742 | A1* | 5/2019 | Hirama | H04L 27/00 |

* cited by examiner

PHASE ANALYSIS CIRCUIT

CROSS-REFERENCE TO RELATED APPLICATIONS

This application is a U.S. National Stage entry of PCT Application No: PCT/JP2017/034927 filed Sep. 27, 2017, the contents of which are incorporated herein by reference.

TECHNICAL FIELD

The present invention relates to a phase analysis circuit for instantaneous measurement of amplitude by an AD converter, configured to constantly and instantaneously output the instantaneous values of the phases of an incoming mutually orthogonal signal pair in parallel with two types of complementary analysis values including discrete analysis values for which a phase of $2\pi$ is divided by n and continuous values which interpolate the discrete analysis values, based on an externally supplied reference-phase base signal.

BACKGROUND ART

Information communication performed using alternating signals as a medium is done by modulating at least one of the amplitude, phase, and frequency of the alternating signals with the information to be transferred.

The instantaneous amplitude of the alternating signals, represented as an I signal and a Q signal obtained by orthogonal decomposition, can be obtained in the form of discrete data of the amplitude at the time of sampling by utilizing two AD converters. For this reason, methods have been widely used in which the amplitude and frequency of the alternating signals are obtained from a set of these data pairs with a conventional technique such as Fourier transform.

Meanwhile, Non-Patent Document 1 has been known in which highly precise frequency analysis (Doppler-shift analysis) was conducted.

PRIOR ART DOCUMENT

Non-Patent Document

NON-PATENT DOCUMENT 1: Suminori Nishie, Masato Akagi: "Acoustic Sound Source Tracking for A Moving Object Using Precise Doppler-Shift Measurement", EUSIPCO 2013 1569746251, September 2013, Morocco

SUMMARY OF THE INVENTION

Problems to be Solved by the Invention

However, in the conventional technique methods, processing is performed with a plurality of pieces of data based on "amplitude measurement involving sampling at predetermined time intervals" by using a sampling theorem. Hence, there is a limitation on the shortest analysis time with respect to the analysis frequency band.

Also, the obtained analysis result is only a discrete analysis result without an interpolative continuous analysis result. Hence, there is a limitation on the range of choice for the processing method for reconstruction of transmitted information. Further, since an accurate precise base frequency supply circuit is needed for each of a transmission circuit and a reception circuit, it is impossible to reduce the size and cost of both circuits.

An object of the present invention is to provide a phase analysis circuit capable of constantly and instantaneously outputting the instantaneous values of the phases of an incoming mutually orthogonal signal pair in parallel with two types of complementary analysis values including discrete analysis values for which a phase of a is divided by n and continuous values which interpolate the discrete analysis values.

Means for Solving the Problem

A phase analysis circuit of the present invention includes: a parallel phase shift circuit configured to perform a phase shift process in parallel on an input signal pair including a first I signal and a first Q signal orthogonal to each other, in accordance with a phase difference among a set of n multi-phase separation frequency signal pairs including a set of second I signals and a set of second Q signals orthogonal to each other, to thereby generate a set of n phase-shifted orthogonal signal pairs including a set of third I signals and a set of third Q signals orthogonal to each other, each of the set of second I signals and the set of second Q signals having a same frequency, a same amplitude, and a phase difference obtained by dividing a phase of $2\pi$ by n; and a phase discrete continuous measurement circuit configured to, based on the n phase-shifted orthogonal signal pairs from the parallel phase shift circuit, generate a set of discrete signals being n discrete values and generate a set of continuous tangent signals being a set of a desired number k of signals interpolating the set of discrete signals, the desired number k being smaller than or equal to n.

Effects of the Invention

According to the present invention, complementary analysis values of the set of discrete signals and the set of continuous tangent signals can be output instantaneously in parallel by the discrete continuous analysis process of the phase discrete continuous measurement circuit. It is also possible to achieve high-accuracy analysis power supported by the phase separation effect by the set of n multi-phase separation frequency signal pairs, and high-resolution analysis power allowing an analysis with a discretization range equal to a phase resolution dividing a phase of $2\pi$ by n, where n is larger than or equal to 16.

Further, it is possible to perform a complementary analysis having both of the high-accuracy analysis power and the high-resolution analysis power as a high-speed analysis capable of constant instantaneous output, by employing an analog-circuit parallel simultaneous processing scheme. The present invention can implement an analysis method with high noise tolerance in which changes in amplitude of an input signal to be analyzed will not be a direct cause of an increase in phase analysis error.

MODES FOR CARRYING OUT THE INVENTION

Figure 1:
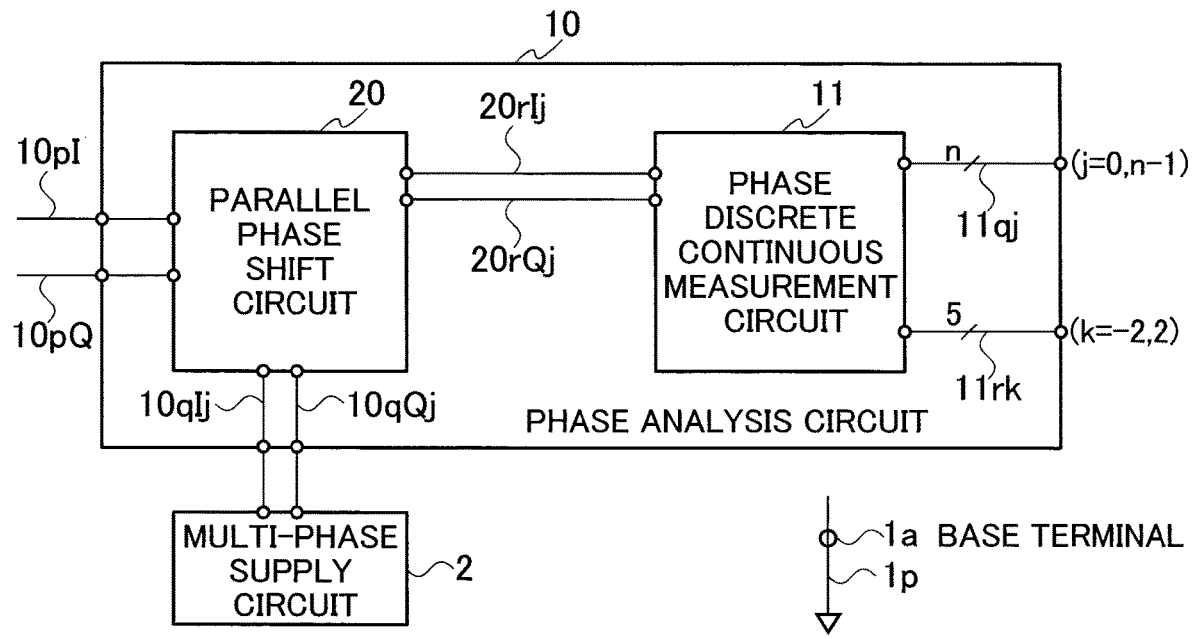
FIG. 1 is a block diagram of a phase analysis circuit in embodiment 1.

The present invention implements a constant analysis of the instantaneous values of the phases of an input signal pair with two types of values including discrete analysis values for which a phase of $2\pi$ is divided by n and continuous analysis values (analog analysis values) which interpolate the discrete analysis values, based on an external phase reference base signal, by using an analog parallel processing circuit, where n is larger than or equal to 16.

The processing is a completely independent analysis of an input signal. However, the input frequency is handled in the processing on condition that it is within an analysis target frequency range. In the processing, an attempt is made to provide a measure to reduce the influence of circuit constant variation, jitter, and white noise by configuring to perform ensemble averages.

The present invention will be described below based on six embodiments. Embodiment 1 will describe a phase analysis circuit. The phase analysis circuit includes a parallel phase shift circuit and a phase discrete continuous measurement circuit. Embodiment 2 will describe details of the parallel phase shift circuit. Embodiment 3 will describe details of the phase discrete continuous measurement circuit.

For the phase discrete continuous measurement circuit, two circuit configurations, namely, a basic type and an IQ adding type, will be disclosed. Embodiment 3 will describe the basic-type phase discrete continuous measurement circuit. Embodiment 4 will describe the IQ adding-type phase discrete continuous measurement circuit. The IQ adding-type phase discrete continuous measurement circuit will be disclosed as a circuit obtained by adding a processing function for performing an IQ addition process to the basic-type phase discrete continuous measurement circuit to be described in embodiment 3.

Embodiment 5 will describe a phase check circuit. The phase check circuit includes a frequency conversion orthogonal decomposition circuit and the phase analysis circuit to be described in embodiment 1. Embodiment 6 will describe an L-th order approximation arctangent circuit configured to enhance the degree of approximation of interpolative continuous values as an example of a near-zero arctangent circuit.

First, an overview of phase measurement in the present invention will be described. The present invention focuses on two quantities including sub-quotient phases obtained by dividing a phase of $2\pi$ by n and sub-remainder phases interpolating these by comparing the quotient phases and the remainder phases of alternating input signals, and detects in parallel the two quantities as a plurality of signal pairs for which $2\pi$ is divided, by using a processing circuit of an autonomous distributed type.

The present invention constantly measures the sub-quotient phases and the sub-remainder phases of the input signals at a desired time in parallel. In doing so, the present invention detects these in such a state that the influence of noise, circuit constant variation, and so on is reduced.

In some drawings, a single solid line with a bar line (slash) diagonally crossing it represents a set of signals. A suffix is attached in accordance with the number of slashes. Also, a suffix j to be described below is a natural number of 0 to n−1 including "0" unless its numerical range is specified. A suffix k is an integer of −2 to +2 unless its numerical range is specified.

Embodiment 1

Next, the configuration of a phase analysis circuit 10 in embodiment 1 will be described using FIG. 1. The phase analysis circuit 10 is configured to instantaneously output the instantaneous values of the phases of an input signal pair in parallel with a plurality of analysis signals based on a set of a plurality of base phase signal pairs with mutually different phases. The phase analysis circuit 10 receives an input signal pair including a one signal 10pI and the other signal 10pQ orthogonal to each other, receives a set of n multi-phase separation frequency signal pairs 10qIQj including set of one signals 10qIj and a set of the other signals 10qQj orthogonal to each other, and generates a set of sub-principal value position signals 11qj and a set of continuous tangent signals 11rk. Also, the phase analysis circuit 10 includes a terminal 1a into which to input a base signal 1p (e.g. earth potential). The phase analysis circuit 10 includes a parallel phase shift circuit 20 of an autonomous distributed processing type and a phase discrete continuous measurement circuit 11 of an autonomous distributed processing type.

The parallel phase shift circuit 20 is configured to generate implicit signals corresponding to discrete signals as discrete analysis values and continuous tangent signals interpolating the discrete signals. The phase discrete continuous measurement circuit 11 is configured to generate explicit signals from the implicit signals.

The parallel phase shift circuit 20 receives the input signal pair including the one signal 10$pI$ and other signal 10$pQ$, which are orthogonal to each other, and the set of n multi-phase separation frequency signal pairs 10$q$IQj including the set of one signals 10$q$Ij and the set of other signals 10$q$Qj, which are orthogonal to each other, each set of signals having the same frequency, the same amplitude, and a phase difference obtained by dividing a phase of $2\pi$ a by n. The parallel phase shift circuit 20 performs a phase shift process on the input signal pair in parallel in accordance with the phase differences in the set of multi-phase separation frequency signal pairs 10$q$IQj, to generate a set of n phase-shifted orthogonal signal pairs 20$r$IQj including a set of one signals 20$r$Ij and a set of other signals 20$r$Qj orthogonal to each other. The parallel phase shift circuit 20 outputs the set of phase-shifted orthogonal signal pairs 20$r$IQj, including the set of one signals 20$r$Ij and the set of other signals 20$r$Qj, which are orthogonal to each other, to a sub-principal value detection circuit 33 in the phase discrete continuous measurement circuit 11.

The phase discrete continuous measurement circuit 11 is configured to perform a phase discrete continuous measurement process on the set of phase-shifted orthogonal signal pairs 20$r$IQj from the parallel phase shift circuit 20 to generate the set of sub-principal value position signals 11$qj$ and the set of continuous tangent signals 11$rk$. The phase discrete continuous measurement circuit 11 performs a phase discrete continuous analysis process on the n phase-shifted orthogonal signal pairs 20$r$IQj from the parallel phase shift circuit 20 to output a resultant set of n discrete signals 10$rj$ and output a resultant set of continuous tangent signals 10$rk$ (k=l1, l2), where k is a desired number of continuous tangent signals to be output smaller than or equal to n, l1=(1−k)/2, and l2=(k−1)/2. Here, the set of signals 10$rj$ is the same as the set of signals 11$qj$, and the set of signals 10$rk$ is the same as the set of signals 11$rk$.

A multi-phase supply circuit 2 is configured to supply the set of mutually orthogonal multi-phase separation frequency signal pairs 10$q$IQj to the phase analysis circuit 10. The amplitudes of the set of one signals 10$q$Ij and the set of other signals 10$q$Qj in the set of mutually orthogonal multi-phase separation frequency signal pairs 10$q$IQj, which are simultaneously supplied together in parallel from the multi-phase supply circuit 2, are all set to substantially the same value, and the phases of the set of one signals 10$q$Ij and the set of other signals 10$q$Qj are set as follows.

For every j, the difference in time average phase between the one signal 10$q$Ij and the other signal 10$q$Qj in the signal pair 10$q$IQj with the same suffix j is set to either a 90° lead or a 90° lag. For every j, the difference in time average phase between signal pairs with successive suffixes j, namely the signal pair 10$q$Ij and the signal pair 10$q$Ij+1, as the increase or decrease in the time average phase of one from the other is set to a phase difference obtained by dividing a phase of $2\pi$ (360°) by a natural number n larger than or equal to 16.

Next, the operation of the phase analysis circuit 10 will be described. Prior to describing the operation of the present invention, an overview of the configuration and function of an AD converter utilizing a conventional technique such as FFT will be described. The AD converter has a function of outputting only a discrete value having a desired discretization resolution as an instantaneous amplitude at a time designated by a desired measurement command strobe signal.

In order to obtain this discrete value, the AD converter utilizes a plurality of base amplitude signals with which the AD converter itself is equipped. The phase analysis circuit 10 of the present invention has at least a function of outputting a set of discrete signals having a discretization resolution dividing a phase of $2\pi$ by n, where n is a natural number larger than or equal to 16, as an instantaneous phase at a time designated by a desired measurement command strobe signal.

In order to obtain this set of discrete signals, the circuit of the present invention utilizes the externally supplied set of a plurality of multi-phase separation frequency signal pairs (base phase signals) 10$q$IQj. Further, the phase analysis circuit 10 of the present invention outputs continuous tangent signals interpolating the set of discrete signals as well. In other words, two types of complementary analysis signals including discrete analysis values and continuous analysis values interpolating them are output simultaneously and instantaneously.

The above continuous analysis values can also be effectively utilized to, for example, reduce the influence of mixing of a multi-path signal and a Doppler shift signal, and detect the degree of mismatch in frequency of a frequency base signal between a transmission circuit and a reception circuit. These cannot be achieved by conventional techniques involving a combination of an AD converter and FFT or the like but can be achieved by the present invention.

According to the phase analysis circuit of the present invention, it is possible to perform a complementary analysis in which discrete analysis values and continuous analysis values are output. It is also possible to achieve high-accuracy analysis power supported by the phase separation effect by the set of n external reference base signal pairs, and high-resolution analysis power allowing an analysis with a discretization range equal to a phase resolution dividing a phase of $2\pi$ by n above, where n is larger than or equal to 16. Further, it is possible to perform the complementary analysis having both of the above high-accuracy analysis power and high-resolution analysis power as a high-speed analysis capable of constant instantaneous output, by employing an analog-circuit parallel simultaneous processing scheme.

A feedback circuit, which "returns a signal from an output terminal only to its input terminal", is assumed to be used only for tangent generation circuits 32. All of the others are of a circuit configuration of an autonomous distributed processing type of a complete parallel balance type involving feedforward processing.

Thus, lags occur only due to the processing time of transistors, the propagation lag time due to the lead inductance and stray capacitance of connections, and so on. Since 240-GHz FD SOI will be put into practical use, the speed is sufficiently high. Further, essentially, in the phase analysis, changes in amplitude of an input signal to be analyzed will not be a direct cause of an increase in analysis error.

Embodiment 2

Figure 2:
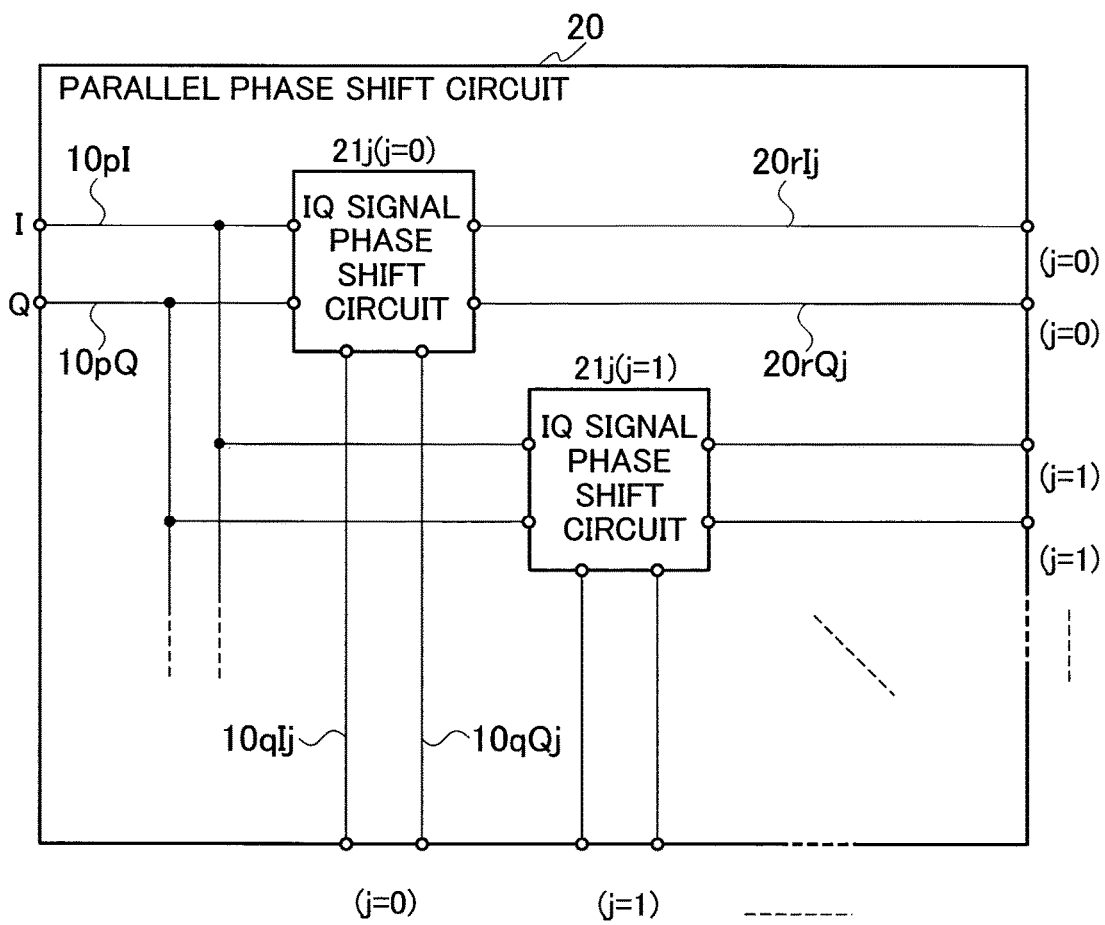
FIG. 2 is a block diagram of a parallel phase shift circuit in embodiment 2.
Figure 3:
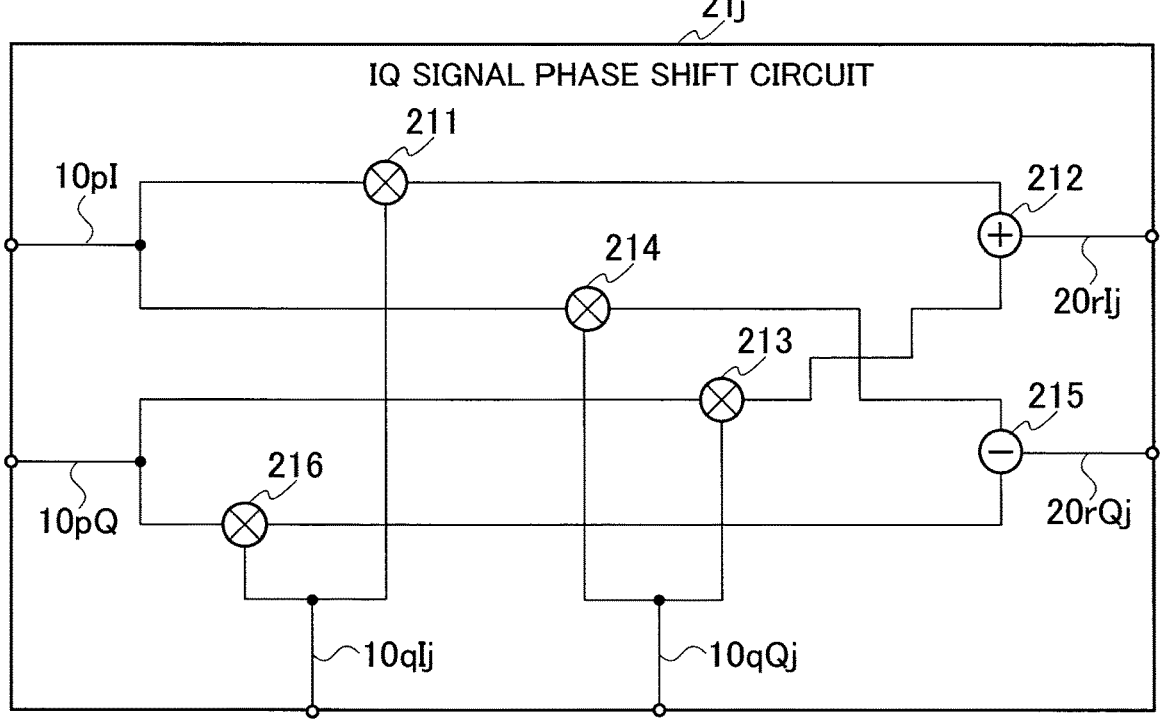
FIG. 3 is a block diagram of an IQ signal phase shift circuit in embodiment 2.

Next, the configuration of the parallel phase shift circuit 20 in embodiment 2 will be described using FIG. 2. The parallel phase shift circuit 20 includes n IQ signal phase shift circuits 21*j* of an autonomous distributed processing type each configured to perform an IQ signal phase shift process on a mutually orthogonal input signal pair IQ and the j-th pair 10*q*IQj in the set of multi-phase separation frequency signal pairs 10*q*IQj, and output the resultant phase-shifted orthogonal signal pair 20*r*IQj. As illustrated in FIG. 3, each IQ signal phase shift circuit 21 j includes a first multiplication circuit 211, a second multiplication circuit 213, a first addition-subtraction circuit 212, a third multiplication circuit 214, a fourth multiplication circuit 216, and a second addition-subtraction circuit 215. Here, the input signal pair IQ is the same as the signal pair 10*p*IQ.

The first multiplication circuit 211 is configured to multiply the signal 10*p*I by the signal 10*q*Ij and output the resultant IIj product signal to the first addition-subtraction circuit 212. The second multiplication circuit 213 is configured to multiply the signal 10*p*Q by the signal 10*q*Qj and output the resultant QQj product signal to the first addition-subtraction circuit 212. The first addition-subtraction circuit 212 is configured to add together the IIj product signal from the first multiplication circuit 211 and the QQj product signal from the second multiplication circuit 213 or subtract one from the other, and output a resultant signal 20*r*Ij.

The third multiplication circuit 214 is configured to multiply the signal 10*p*I by the signal 10*q*Qj and output the resultant IQj product signal to the second addition-subtraction circuit 215. The fourth multiplication circuit 216 is configured to multiply the signal 10*p*Q by the signal 10*q*Ij and output the resultant QIj product signal to the second addition-subtraction circuit 215. The second addition-subtraction circuit 215 is configured to add together the IQj product signal from the third multiplication circuit 214 and the QIj product signal from the forth multiplication circuit 216 or subtract one from the other, and output a resultant signal 21*r*Qj.

Note that whether to perform addition or subtraction at the first addition-subtraction circuit 212 and the second addition-subtraction circuit 215 is selected such that when addition is set for one addition-subtraction circuit, subtraction is set for the other addition-subtraction circuit. In this case, the selection is made based on which one of a component signal having the sum of the frequency of the signal supplied to one output terminal and the frequency of the signal supplied to the other terminal and a component signal having the difference between these frequencies is desired to be output. Further, in implementing the subtraction function, the subtrahend terminal and the minuend terminal are selected such that the sign of the phase can be the desired value.

Next, the operation of the parallel phase shift circuit 20 will be described. The parallel phase shift circuit 20 illustrated in FIG. 2 is configured to shift phases θ of the input signal pair to the phases of a phase-shifted orthogonal signal pair by a shift phase θj of the j-th multi-phase separation frequency signal pair set to a desired value. By this phase shift, the one phase-shifted orthogonal signal 20*r*Ij (Ij) and the other phase-shifted orthogonal signal 20*r*Qj (Qj) in the parallel phase shift circuit 20 are expressed by the following equations.

$$I_j = I_j \pm Q_j Q \cong E_{cj}E_c \cdot \cos(\theta_{ecj})\cos(\theta_{ec}) \cdot \cos(A) \quad (2\text{-}1a)$$

$$Q_j = I_j Q \mp Q_j I \cong E_{sj}E_s \cdot \cos(\theta_{ecj})\cos(\theta_{ec}) \cdot \sin(A) \quad (2\text{-}1b)$$

$$A = (\omega_j \mp \omega)t + (\theta_j \mp \theta) \quad (2\text{-}1c)$$

Here, θecj and θec are phase errors from the orthogonality of the two mutually orthogonal signals in each of the multi-phase separation frequency signal pair and the input signal pair. Ec and Es are the amplitudes of the mutually orthogonal input signals in the input signal pair. Also, ω and θ are the frequency and phase of the input signal pair. The suffix j is the value of the pair position j among the set of multi-phase separation frequency signal pairs.

Note that (2-1a), (2-1b), and (2-1c) assume that $E_{cj}E_c = E_{sj}E_s$. This condition can be actually achieved with good approximation. (2-1a), (2-1b), and (2-1c) mean that the sum of and the difference between the IIj product signal and the QQj product signal give the difference between and the sum of beat frequencies, and that the difference between and the sum of the IQj product signal and the QIj product signal give the difference between and the sum of the beat frequencies.

At the same time, the phases θj of the set of multi-phase separation frequency signal pairs j and the phases θ of the input signal pair also have a difference-sum relation. This means that the phases of Ij and Qj, or the output signals of the IQ signal phase shift circuits 21 are shifted in accordance with the phases θj of the set of multi-phase separation frequency signal pairs j.

The multiplication circuits generate both a high frequency component and a low frequency component. However, in FIG. 3, one of a difference frequency component and a sum frequency component is selected using the canceling process by the addition-subtraction circuit. Also, implementing the orthogonality of each output signal pair from the multi-phase supply circuit 2, which is an external circuit, is very easy due to the reason to be described later. Hence, each phase-shifted orthogonal signal pair Ij and Qj, which are the output signals in FIG. 2, have good orthogonality.

Meanwhile, the following is a postscript about the parallel phase shift circuit 20. The frequency of the set of multi-phase separation frequency signal pairs 10*q*IQj is not set such that near zero beat frequency appears as in homodyne detection. A function of controlling the amplitudes of the phase-shifted orthogonal signals can implemented by changing the amplitudes of the set of multi-phase separation frequency signal pairs, as in a typical mixer circuit.

Next, the correlation between the phases of the input signals and the phases of the set of multi-phase separation frequency signal pairs at n phase separation points in the parallel phase shift circuit 20 will be described using FIG. 4. A case will be exemplarily presented in which the phase difference between adjacent multi-phase separation frequency signal pairs is set to a value obtained actually by evenly dividing a phase of 2π by n, and the number n of pairs is 16.

Figure 4:
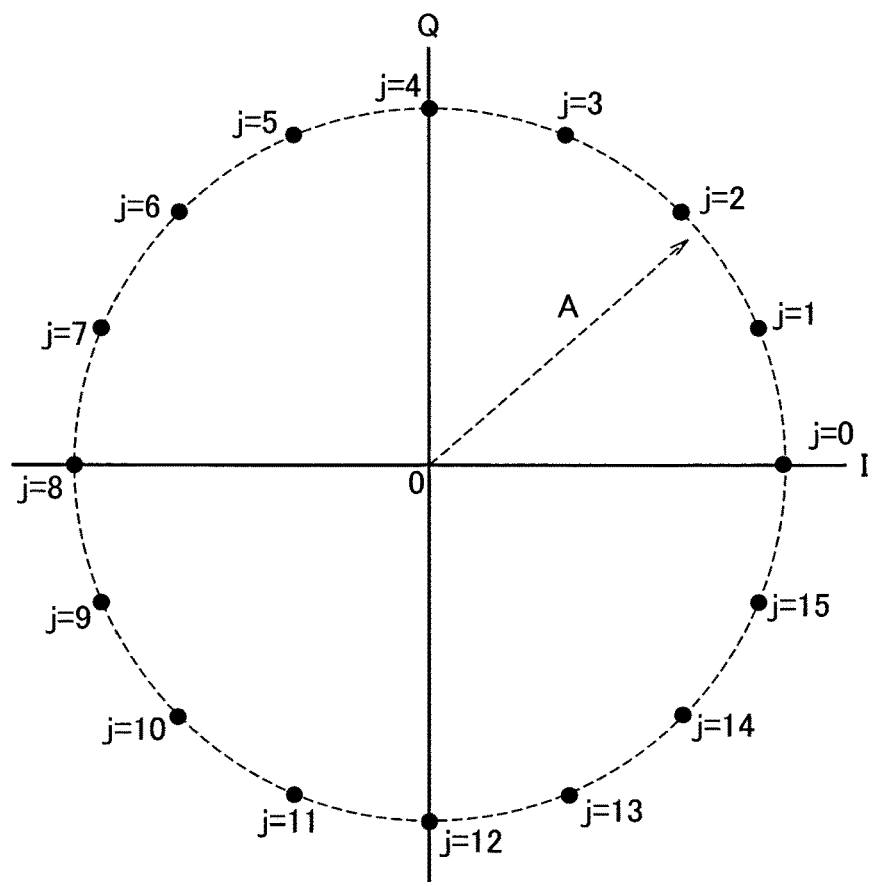
FIG. 4 is an explanatory diagram of a constellation of n "separation points" for a set of n multi-phase separation frequency signal pairs in embodiment 2.

The vertical Q axis in FIG. 4 is an axis rotated by π/2 in the positive direction from the horizontal I axis about an origin 0. The 16 points j arranged on the same circle will be referred to as phase separation points θj and correspond to the first term θj in the second parentheses of A described in equation (2-1c). Here, θj is actually set to 2π/n×j in the embodiment.

The dotted arrow A illustrated from the origin 0 to near the phase separation point j=2 is the product of the first-term parentheses part and a time t to the right of the term A described in equation (2-1c), indicating the phase at a given time t. The arrow A is near j=2. The phase separation point j near the input signal will be referred to as the sub-quotient phase position js.

With the above, the parallel phase shift circuit 20 brings about the following advantageous effects. Analysis values obtained by precisely discretizing the phases of the input signals, which are a continuous quantity, by means of the separation effect by the set of multi-phase separation frequency signal pairs, are output in parallel. The plurality of phase-shifted orthogonal signals 20rIQj output in parallel are signals whose values can be relatively compared with those with different values of j. Hence, it is possible to perform parallel processing capable of instantaneous precise detection in the state where precision obtained by dividing a phase of 2π by n is ensured.

Even when the input signals change in amplitude, the amplitude change does not directly influence the amplitude of the phase-shifted orthogonal signal pairs 20rIQj output in parallel. Hence, a precise analysis is possible. Since each of the frequency, phase, and amplitude of the multi-phase separation frequency signals is constant in terms of time, it is easy to manage the orthogonality and the like of the mutually orthogonal output signals in each pair. Since a discrete analysis is performed across a phase of 2π with a discretization resolution obtained by the 2π/n phase separation effect, the required observation time intervals at which to discretely grasp the time-series change in phase can be shortened to "1/n".

Embodiment 3

A basic-type phase discrete continuous measurement circuit 30 in embodiment 3 is configured to perform a phase discrete continuous analysis process, which is parallel processing, on the set of n phase-shifted orthogonal signal pairs generated by the parallel phase shift circuit 20, for which a phase of 2π is divided by n, explicitly detect the position js (sub-principal value position js) of one phase-shifted orthogonal signal pair with a phase at which the amplitude is the smallest, which is always present among the set of n phase-shifted orthogonal signal pairs, and detect at least one sub-remainder phase θaj (j=js) (continuous tangent signal θajs) at the sub-principal position js.

An overview of the phase discrete continuous measurement circuit 30 will be described using FIG. 5. The phase discrete continuous measurement circuit 11 is configured to perform a phase discrete analysis and a continuous analysis that interpolates it by using tangent signal values instead of arctangent signal values. This is because using tangent signal values does not impair the accuracy in principle, and a circuit that obtains tangent signal values has a simpler circuit configuration than a circuit that obtains arctangent signal values.

The phase discrete continuous measurement circuit 30 is configured to receive the set of phase-shifted orthogonal signal pairs 20rIQj and output a set of discrete signals 30rj and a set of continuous tangent signals 30sk. The phase discrete continuous measurement circuit 30 includes a tangent circuit 31 and a sub-principal value detection circuit 33. The tangent circuit 31 is configured to perform a tangent process on the set of phase-shifted orthogonal signal pairs 20rIQj and output a resultant set of tangent signals 31qj (32qj) to the sub-principal value detection circuit 33. The sub-principal value detection circuit 33 is configured to perform a sub-principal value discrete continuous detection process on the set of signal pairs 20rIQj and the set of signals 31qj from the tangent circuit 31 and output the resultant set of discrete signals 30rj (10rj) and the resultant set of continuous tangent signals 30sk (10sk).

Figure 6:
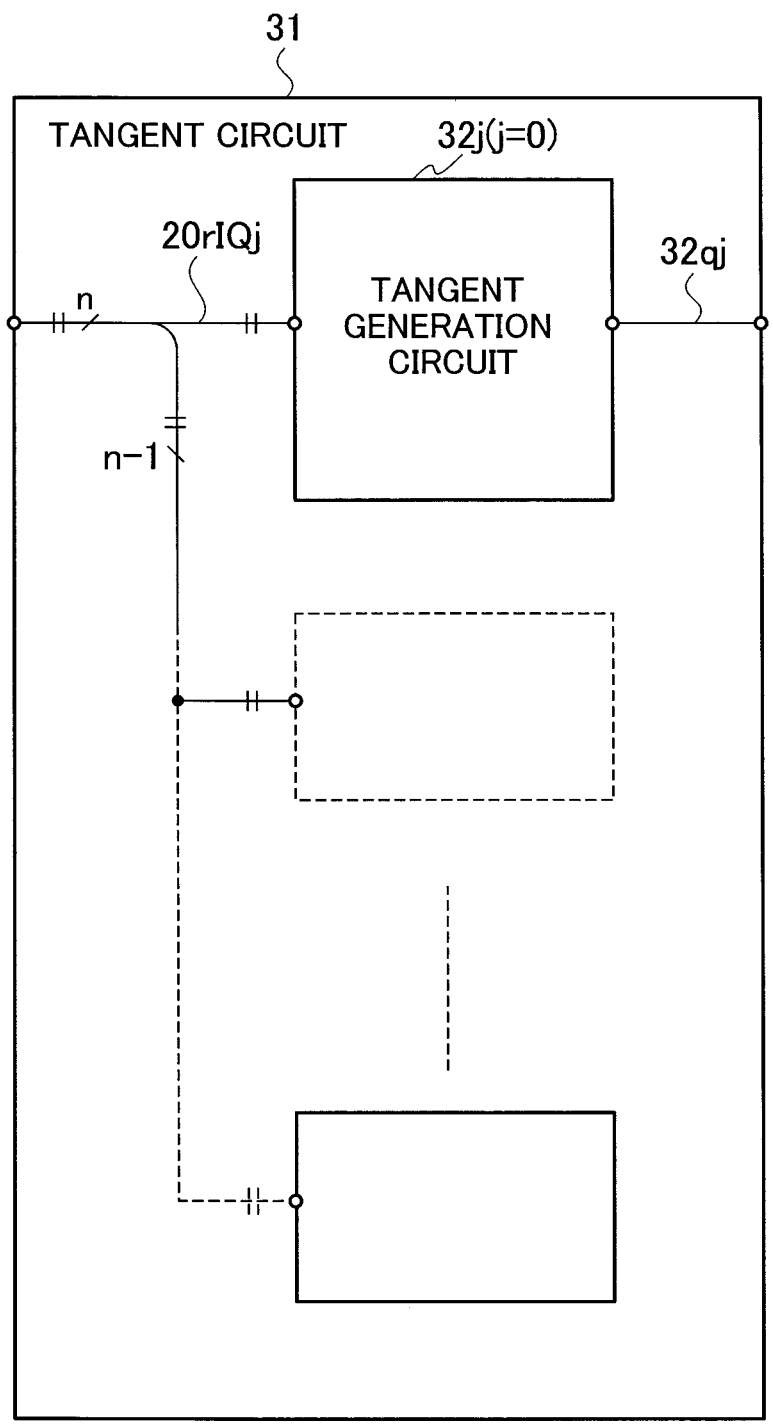
FIG. 6 is a block diagram of a tangent circuit in embodiment 3.
Figure 7:
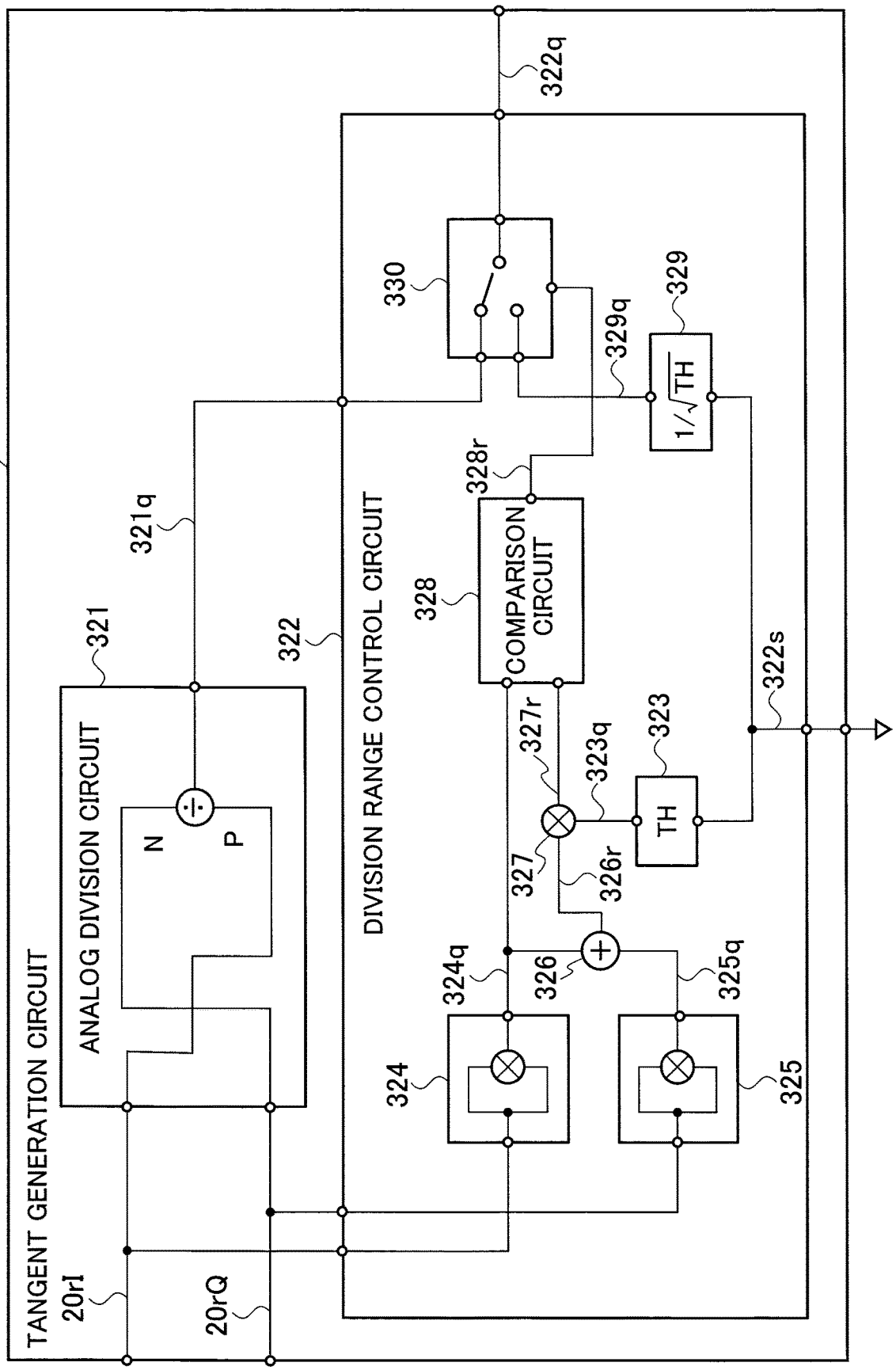
FIG. 7 is a block diagram of a tangent generation circuit in embodiment 3.

The tangent circuit 31 illustrated in FIG. 6 includes n tangent generation circuits 32j of an autonomous distributed processing type each configured to perform a tangent process on the j-th input signal pair 20rIQj and output a resultant j-th output signal 32qj. In principle, the tangent generation circuits 32 each illustrated in FIG. 7 include n analog division circuits 321 each configured to divide the Q signal constituting one pair in the set of n parallel phase-shifted orthogonal signal pairs by the I signal constituting that pair. In the present invention, the result of the division is utilized only when the value of the numerator is smaller than the value of the denominator. A division range control circuit 322 is used to determine whether this state is met.

This is because the present invention uses a set of signal pairs for which a phase of 2π is divided by n, and therefore does not use a signal in which the I signal in the denominator of the Q/I division operation is smaller. Being able to do this is a major advantageous effect based on the use of the signals from the parallel phase shift circuit 20 illustrated in FIG. 2 for which a phase of 2π is divided by n.

Each tangent generation circuit 32 includes the analog division circuit 321 and the division range control circuit 322. The analog division circuit 321 is configured to output a quotient signal obtained by dividing the other signal supplied to one of paired input terminals by the one signal supplied to the other, to the division range control circuit 322. The division range control circuit 322 is configured to output the quotient signal from the analog division circuit 321 if the value of a squared signal of the one signal (one squared signal) is larger than or equal to a value obtained by applying a predetermined first threshold to a sum squared signal being the sum of the one squared signal and a squared signal of the other signal (other squared signal). The division range control circuit 322 is configured to output a signal proportional to a predetermined second threshold if the value of the one squared signal is smaller than the value obtained by applying the predetermined first threshold.

The tangent generation circuit 32 receives the one signal 20rI and the other signal 20rQ and outputs a tangent signal 322q. The analog division circuit 321 performs a division process of dividing the signal 20rQj by the signal 20rI and outputs a resultant quotient signal 321q to the division range control circuit 322. The division range control circuit 322 performs a division range control process on the signal 20rI, the signal 20rQ, and the quotient signal 321q based on a base signal 322s supplied thereto, and outputs the resultant tangent signal 322q.

The division range control circuit 322 includes a first amplitude squaring circuit 324, a second amplitude squaring circuit 325, an addition circuit 326, a first threshold signal circuit 323, a multiplication circuit 327, a comparison circuit 328, a second threshold signal circuit 329, and a signal selection circuit 330.

The first amplitude squaring circuit 324 is configured to perform a squaring process on the signal 20rI and output a resultant signal 324q to the addition circuit 326 and the comparison circuit 328. The second amplitude squaring circuit 325 is configured to perform a squaring process on the signal 20rQ and output a resultant signal 325q to the addition circuit 326. The addition circuit 326 is configured to add together the signal 324q from the first amplitude squaring circuit 324 and the signal 325q from the second amplitude squaring circuit 325 and output a resultant signal 326r to the multiplication circuit 327. The first threshold signal circuit 323 is configured to perform a threshold signal generation process based on the supplied signal 322s and output a resultant desired first threshold signal 323q to the multiplication circuit 327.

The multiplication circuit 327 is configured to multiply the signal 326r from the addition circuit 326 by the first threshold signal 323q from the first threshold signal circuit 323 and output a resultant signal 327r to the comparison circuit 328. The comparison circuit 328 is configured to compare the amplitude of the signal 324$q$ from the first amplitude squaring circuit 324 and the amplitude of the signal 327$r$ from the multiplication circuit 327, and output a signal 328$r$ of "+1" to the signal selection circuit 330 if the signal 324$q$ is larger in amplitude than the signal 327$r$, and otherwise output a signal 328$r$ of "−1" to the signal selection circuit 330. The second threshold signal circuit 329 is configured to perform a threshold signal generation process based on the supplied signal 322$s$ and output a resultant desired second threshold signal 329$q$ to the signal selection circuit 330. The signal selection circuit 330 is configured to select the signal 321$q$ if the signal 328$r$ is "+1" whereas selecting the signal 329$q$ if the signal 328$r$ is "−1", and output the signal 322$q$ thus selected.

Figure 8:
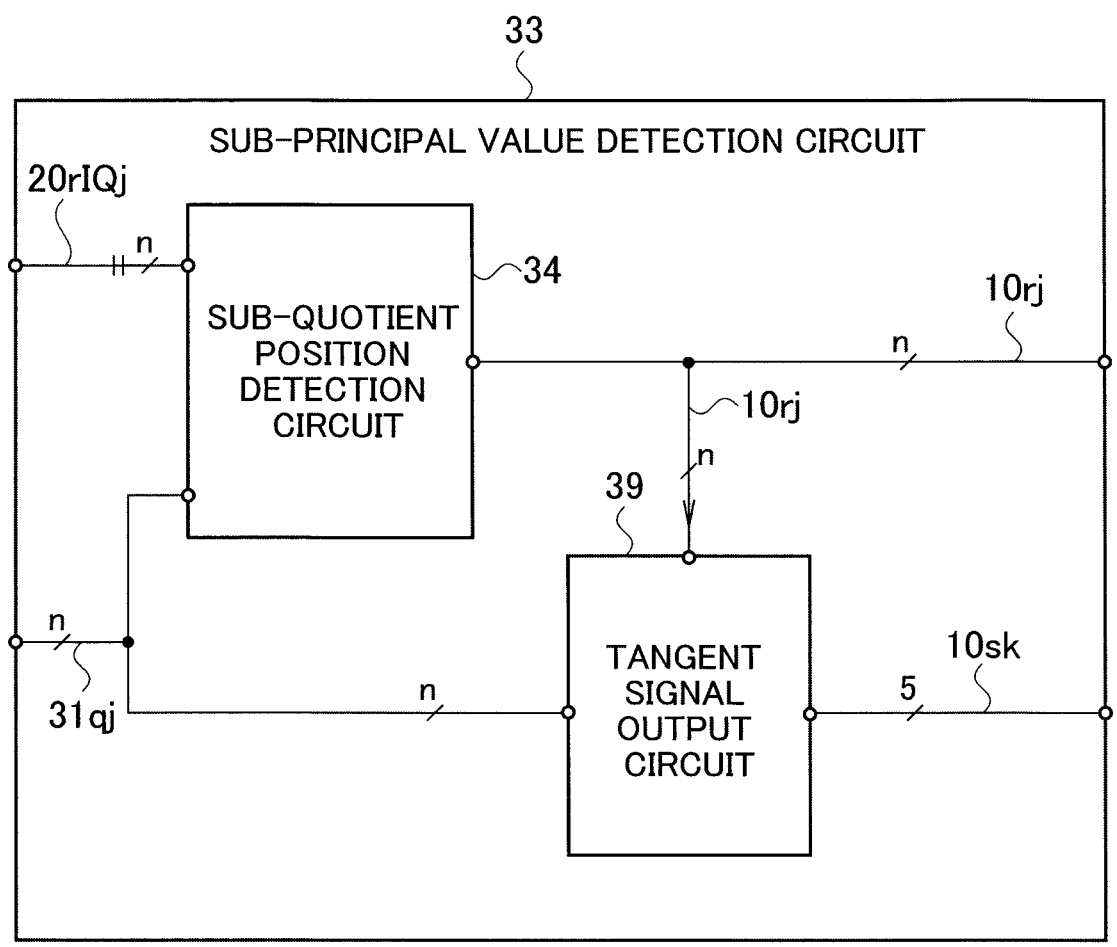
FIG. 8 is a block diagram of a sub-principal value detection circuit in embodiment 3.

The sub-principal value detection circuit 33 illustrated in FIG. 8 includes a sub-quotient position detection circuit 34 and a tangent signal output circuit 39. The sub-quotient position detection circuit 34 is configured to perform a sub-quotient position detection process on the set of phase-shifted orthogonal signal pairs 20$r$IQj and the set of tangent signals 31$qj$, output the resultant set of discrete signals 10$rj$ as output signals of the phase discrete continuous measurement circuit 30, and output the set of discrete signals 10$rj$ also to the tangent signal output circuit 39. The tangent signal output circuit 39 is configured to perform a tangent signal output process based on the set of signals 31$qj$ and the set of signals 10$rj$ and output the resultant set of continuous tangent signals 10$sk$.

Figure 9:
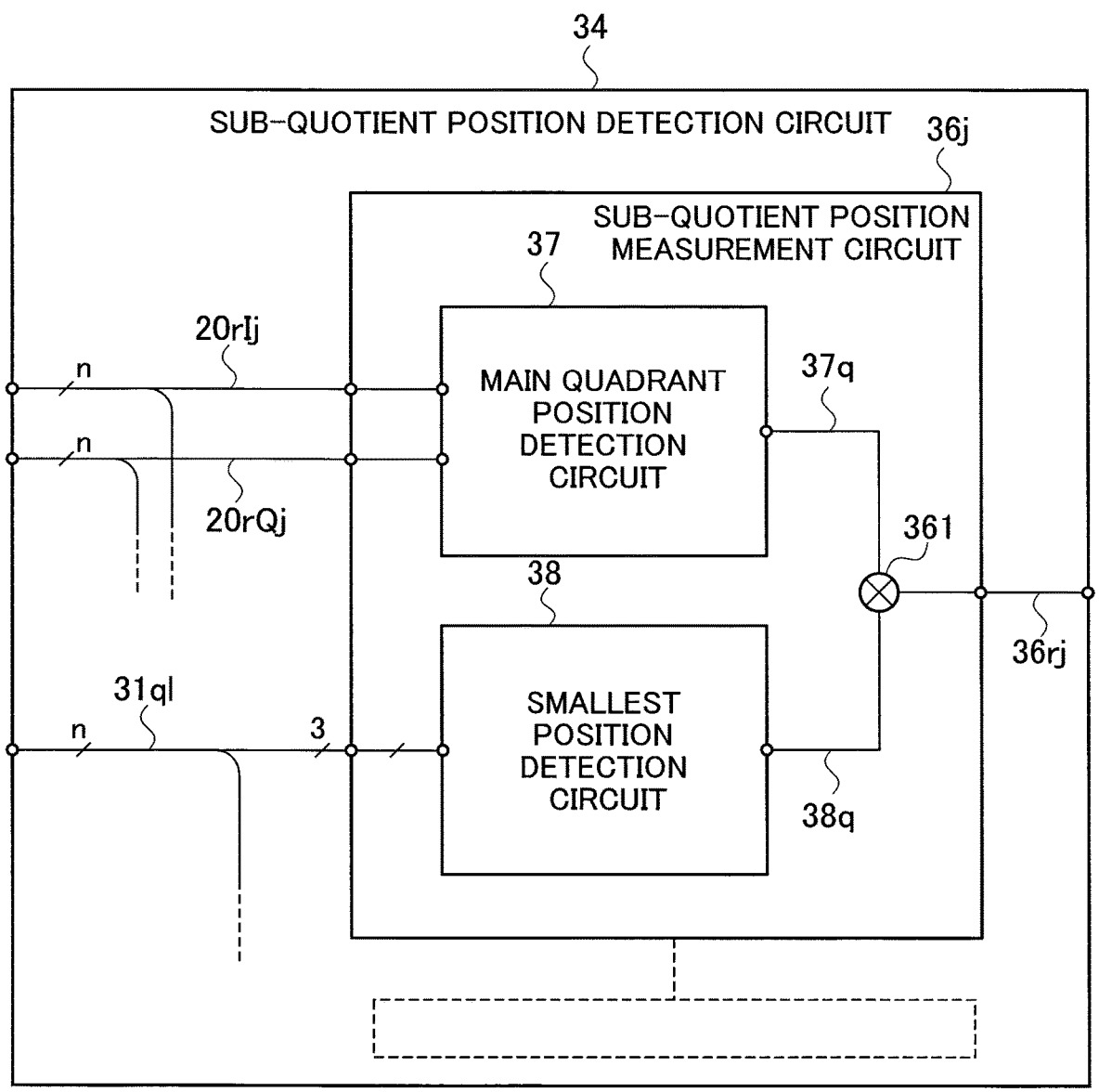
FIG. 9 is a block diagram of a sub-quotient position detection circuit in embodiment 3.

In principle, the sub-quotient position detection circuit 34 illustrated in FIG. 9 detects the position j of the tangent signal 31$qj$ with the smallest absolute value among the n tangent signals 31$qj$. Here, in addition to the tangent signal at the intended phase position j, there is another tangent signal with the same value at the position j shifted by π in phase. This makes it impossible to define one position as the intended position j. In order to define the intended position j, each sub-quotient position measurement circuit 36 is configured to obtain the logical conjunction between a 'rough analysis result' by a main quadrant position detection circuit 37 and a 'precise analysis result' by a smallest position detection circuit 38 as a sub-quotient position detection result. For this reason, two types of signals 20$r$IQj and 31$qj$ are used as the input signals.

The sub-quotient position detection circuit 34 includes n sub-quotient position measurement circuits 36$j$ of an autonomous distributed processing type each configured to perform a sub-quotient position measurement process on the j-th phase-shifted orthogonal signal pair 20$r$IQj and a set of l-th tangent signals 31$ql$ (k=−1, +1), and output the resultant j-th discrete signal 36$rj$, where k represents values designating the tangent signals itself and positions adjacent thereto, and also l=mod(j +k, n). Each sub-quotient position measurement circuit 36$j$ includes a main quadrant position detection circuit 37, a smallest position detection circuit 38, and a multiplication circuit 361. The main quadrant position detection circuit 37 is configured to perform a main quadrant position detection process on the phase-shifted orthogonal signal pair 20$r$IQj and output a resultant main quadrant position signal 37$q$ to the multiplication circuit 361. The smallest position detection circuit 38 is configured to perform a smallest position detection process on a set of tangent signals 31$qk$ (k=−1, +1) and output a resultant smallest position signal 38$q$ to the multiplication circuit 361. The multiplication circuit 361 is configured to multiply the main quadrant position signal 37$q$ from the main quadrant position detection circuit 37 by the smallest position signal 38$q$ from the smallest position detection circuit 38 and output the resultant sub-quotient position signal 36$rj$ (discrete signal 30$rj$).

Here, description will be given of the relation between l, j, k, and n in the equation "l=mod(j+k, n)", indicating a remainder relation. The parameters of the mod function on the right-hand side are a first parameter and a second parameter separated by the comma. The first parameter is the sum of j designating the terminal position and k designating a value by which to shift the terminal position. The second parameter is a natural number n larger than or equal to 16, which will be referred to as the modulus. j represents n terminal positions l and is a natural number of 0 to n−1 including "0" at intervals of "1". k is an integer whose absolute value is not larger than n−1.

The value of the first parameter, or the sum of j and k, represents three cases. The mod function performs three function processes for these three cases. In a first process, when the value of the first parameter is 0 to n−1, that value is returned to the left-hand side l. In a second process, when the value of the first parameter is less than 0, a value obtained by adding the modulus n a necessary number of times is returned to the left-hand side l if that value is 0 to n−1. In a third process, when the value of the first parameter is larger than n−1, a value obtained by subtracting the modulus n a necessary number of times is returned to the left-hand side l if that value is 0 to n−1.

The mod function is a function that returns the remainder resulting from the division by the modulus n (remainder calculation function). In this case, what is characteristic is that the returned value is 0 to n−1.

Figure 10:
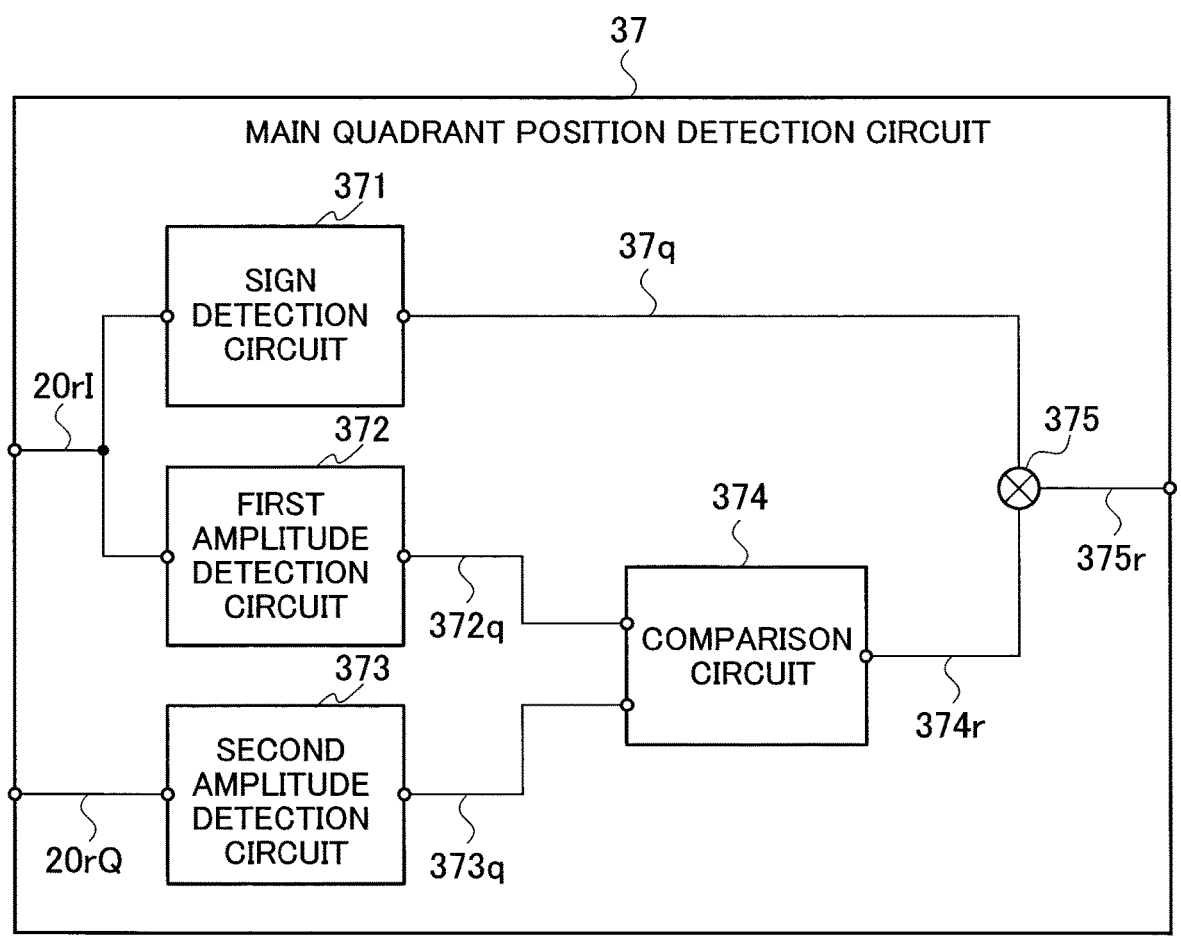
FIG. 10 is a block diagram of a main quadrant position detection circuit in embodiment 3.

The configuration of the main quadrant position detection circuit 37 will be described using FIG. 10. The main quadrant position detection circuit 37 detects a first state when the sign of the one input signal 20$r$I is positive, and detects a second state when the amplitude of the one input signal 20$r$I is larger than the amplitude of the other input signal 20$r$Q. The main quadrant position detection circuit 37 outputs a main quadrant position detection signal 37$q$ (375$r$) of "1" when the first state and the second state are both met, and outputs a main quadrant position detection signal 37$q$ (375$r$) of "0" in other states.

The main quadrant position detection circuit 37 includes a sign detection circuit 371, a first amplitude detection circuit 372, a second amplitude detection circuit 373, a comparison circuit 374, and a multiplication circuit 375. The sign detection circuit 371 is configured to perform a sign detection process of generating "1" when the sign of the signal 20$r$I is positive and otherwise generating "0", and output the resultant signal 37$q$ to the multiplication circuit 375. The first amplitude detection circuit 372 is configured to perform an amplitude detection process on the signal 20$r$I and output a resultant signal 372$q$ to the comparison circuit 374. The second amplitude detection circuit 373 is configured to perform an amplitude detection process on the signal 20$r$Qj and output a resultant signal 373$q$ to the comparison circuit 374. The comparison circuit 374 is configured to perform an amplitude comparison process of comparing the amplitude of the signal 372$q$ (I amplitude) and the amplitude of the signal 373$q$ (Q amplitude) and generating "1" when the I amplitude is larger than the Q amplitude and otherwise generating "0", and output a resultant signal 374$r$ to the multiplication circuit 375. The multiplication circuit 375 is configured to multiply the signal 37$q$ from the sign detection circuit 371 by the signal 374$r$ from the comparison circuit 374 and output the resultant signal 375$r$.

Figure 11:
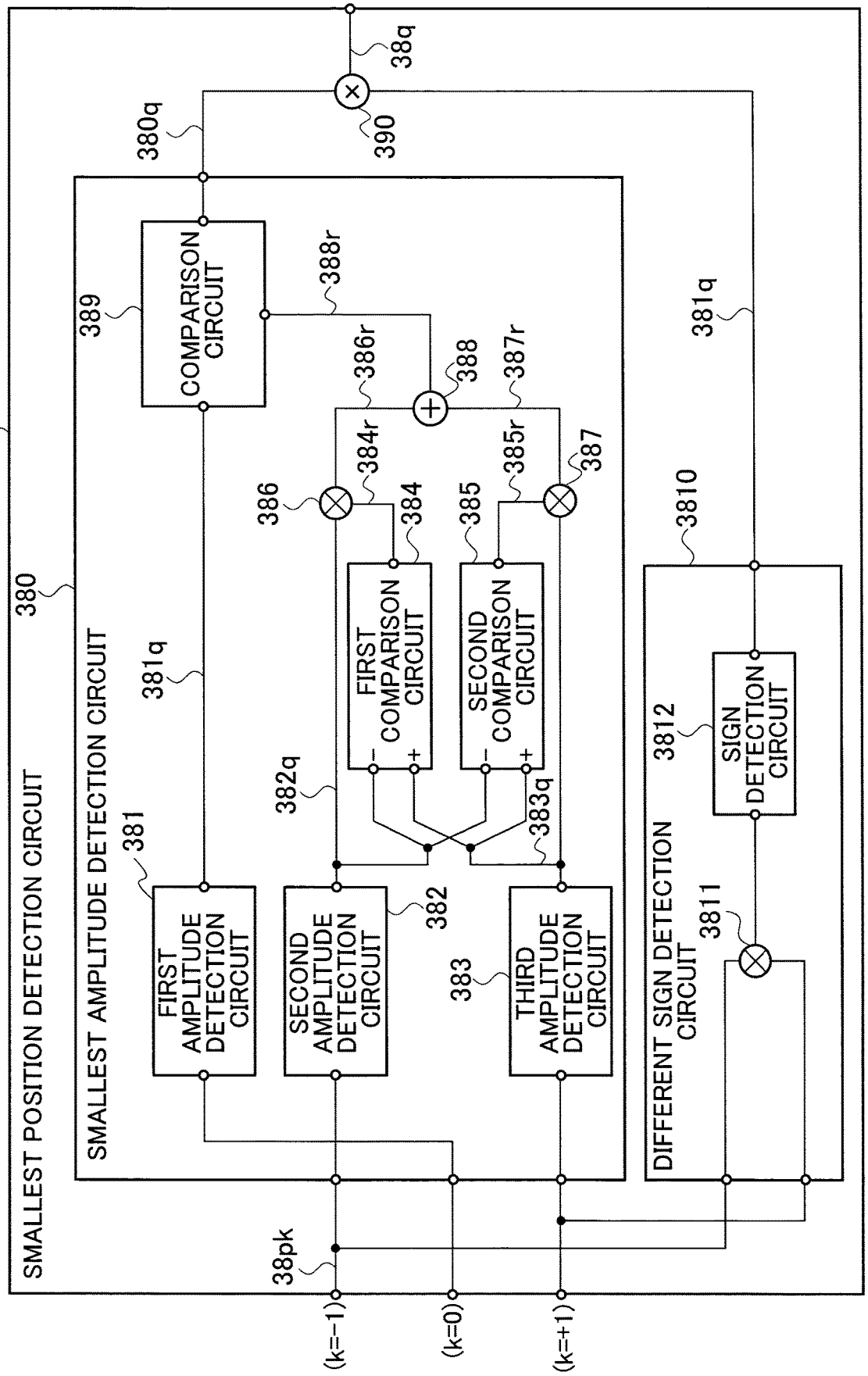
FIG. 11 is a block diagram of a smallest position detection circuit in embodiment 3.

The smallest position detection circuit 38 illustrated in FIG. 11 receives a set of tangent signals 38pk (k=−1, +1) and outputs the smallest position signal 38q. For the signals at three phase positions including the discrete phase position j of the smallest position detection circuit 38 itself (phase position k=±0) and the adjacent phase positions j−1 (phase position k=−1) and j+1 (phase position k=+1), when the absolute value of the amplitude of the tangent signal at the phase position j of the smallest position detection circuit 38 itself is smaller (smallest) than any of the absolute value of the amplitude of the tangent signal at the phase position j−1 and the absolute value of the amplitude of the tangent signal at the phase position j+1, the smallest position detection circuit 38 outputs a signal of "1" indicating a smallest position state as the smallest position signal 38q, and otherwise outputs a signal of "0" as the smallest position signal 38q. Note that in a case where only the discrete signals 30rj are needed from the function of the sub-principal value detection circuit 33, the tangent signals may be the other signals 20pQj in a set of phase-shifted orthogonal signal pairs.

Detailed description will further be given by exemplarily referring to the case of using the tangent signals. The smallest position detection circuit 38 includes a smallest amplitude detection circuit 380, a different sign detection circuit 3810, and a multiplication circuit 390. The smallest position detection circuit 38 can function with a circuit configuration including the smallest amplitude detection circuit 380 alone. However, the smallest position detection circuit 38 can be expected to achieve an advantageous effect of enhancing the noise tolerance by further including the different sign detection circuit 3810.

The smallest amplitude detection circuit 380 is configured to output a signal 380q of "1" as a signal corresponding to "true" when the absolute value of the amplitude of the tangent signal 38pk (k=±0) is the smallest among the three tangent signals 38pk (k=−1), 38pk (k=±0), and 38pk (k=+1), and otherwise output a signal 380q of "0" as a signal corresponding to "false". The different sign detection circuit 3810 is configured to output a signal 381q of "1" as a signal corresponding to "true" when the sign of the signal 38pk (k=−1) and the sign of the signal 38pk (k=+1) are different signs, and otherwise output a signal 381q of "0" as a signal corresponding to "false". The multiplication circuit 390 is configured to multiply the signal 380q from a comparison circuit 389 by the signal 381q from the different sign detection circuit 3810 and output the resultant signal 38q.

The smallest amplitude detection circuit 380 includes a first amplitude detection circuit 381, a second amplitude detection circuit 382, a third amplitude detection circuit 383, a first comparison circuit 384, a second comparison circuit 385, a first multiplication circuit 386, a second multiplication circuit 387, an addition circuit 388, and the comparison circuit 389. The first amplitude detection circuit 381 is configured to perform an amplitude detection process on the tangent signal 38pk (k=±0) and output a resultant signal 381q to the comparison circuit 389. The second amplitude detection circuit 382 is configured to perform an amplitude detection process on the tangent signal 38pk (k=−1) and output a resultant signal 382q to the comparison circuits 384 and 385 and the multiplication circuit 386. The third amplitude detection circuit 383 is configured to perform an amplitude detection process on the tangent signal 38pk (k=+1) and output a resultant signal 383q to the comparison circuits 384 and 385 and the multiplication circuit 387.

The first comparison circuit 384 is configured to perform a comparison process of comparing the signal 382q from the second amplitude detection circuit 382 and the signal 383q from the third amplitude detection circuit 383 and generating a signal of "1" as a signal corresponding to "true" when the signal 382q is smaller than the signal 383q, and otherwise generating a signal of "0" as a signal corresponding to "false", and output a resultant signal 384r. The second comparison circuit 385 is configured to perform a comparison process of comparing the signal 382q from the second amplitude detection circuit 382 and the signal 383q from the third amplitude detection circuit 383 and generating a signal of "1" as a signal corresponding to "true" when the signal 383q is smaller than the signal 382q, and otherwise generating a signal of "0" as a signal corresponding to "false", and output a resultant signal 385r. The first multiplication circuit 386 is configured to multiply the signal 382q from the second amplitude detection circuit 382 by the signal 384r from the first comparison circuit 384 and output a resultant signal 386r. The second multiplication circuit 387 is configured to multiply the signal 383q from the third amplitude detection circuit 383 by the signal 385r from the second comparison circuit 385 and output a resultant signal 387r. The addition circuit 388 is configured to add together the signal 386r from the first multiplication circuit 386 and the signal 387r from the second multiplication circuit 387 and output a resultant signal 388r. The comparison circuit 389 is configured to perform a comparison process of comparing the signal 381r from the first amplitude detection circuit 381 and the signal 388r from the addition circuit 388 and generating a signal of "1" as a signal corresponding to "true" when the signal 381q is smaller than the signal 388r and otherwise generating a signal of "0" as a signal corresponding to "false", and output a resultant signal 380q to the multiplication circuit 390.

The different sign detection circuit 3810 includes a multiplication circuit 3811 configured to multiply the tangent signal 38pk (k=−1) by the tangent signal 38pk (k=+1) and output a resultant signal, and a sign detection circuit 3812 configured to perform a sign detection process on the signal from the multiplication circuit 3811 and output a signal 381q of "1" to the multiplication circuit 390 when the above signals have different signs, and otherwise output a signal 381q of "0" to the multiplication circuit 390. The multiplication circuit 390 is configured to multiply the signal 389q from the comparison circuit 389 by the signal 381q from the sign detection circuit 3812 and output the resultant signal 38q.

Figure 12:
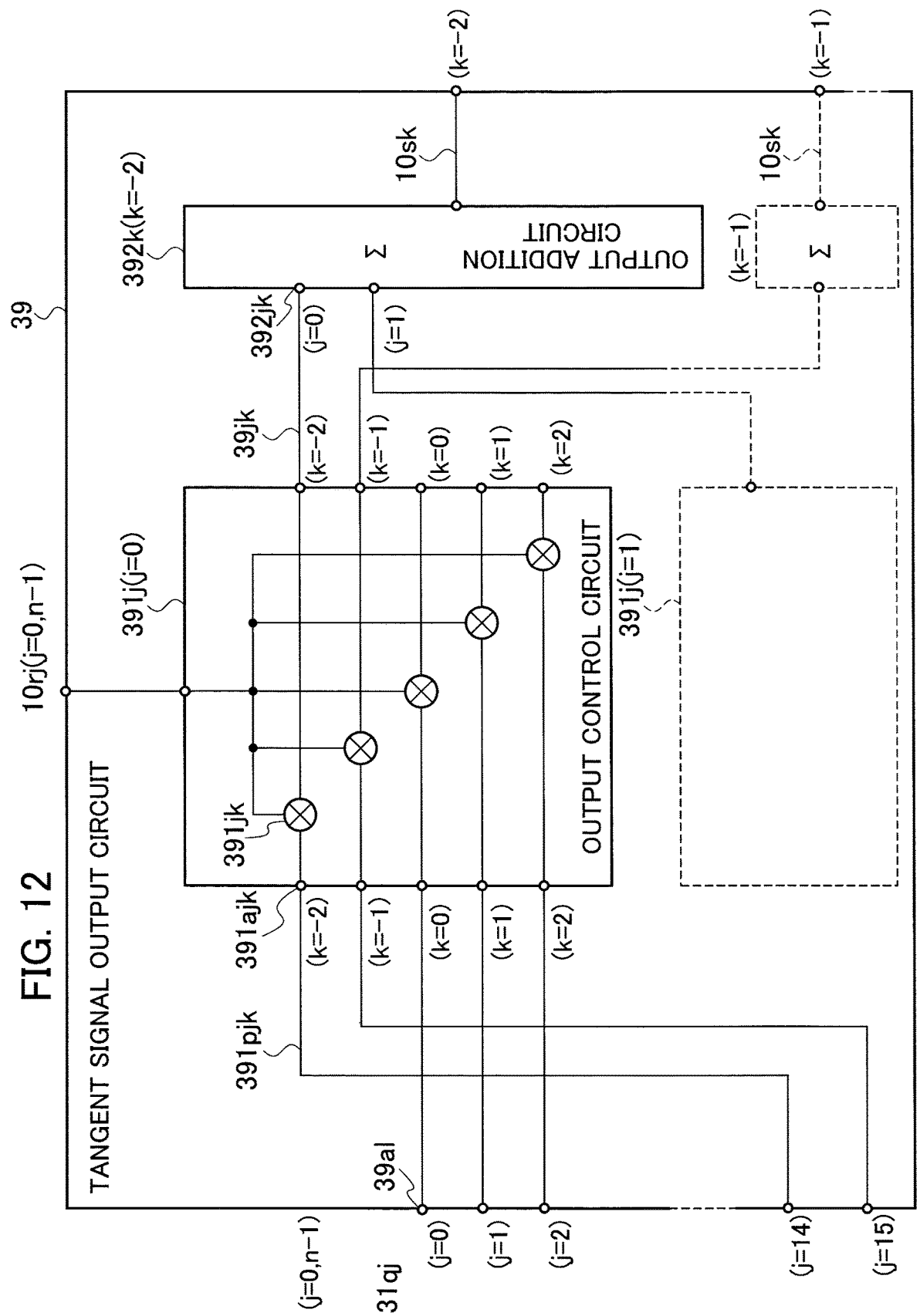
FIG. 12 is a block diagram of a tangent signal output circuit in embodiment 3.

As illustrated in FIG. 12, the tangent signal output circuit 39 includes n output control circuits 391j of an autonomous distributed processing type and k output addition circuits 392k (k=11, 12) of an autonomous distributed processing type. The output control circuit 391j is configured to receive the set of tangent signals 31qj, receive the set of sub-quotient position signals (set of discrete signals) 10rj, and output sets of continuous tangent signals 39qk (k=11, 12), where k is a desired number of continuous tangent signals to be output smaller than or equal to n, l1=(1−k)/2, and l2=(k−1)/2.

Each output control circuit 391j performs an output control process on a set of tangent signals 391pjk (k=l1, l2) based on the sub-quotient position signal 10rj and outputs a resultant set of selected tangent signals 39jk (k=l1, l2) to a set of j-th input terminals 392jk (k=l1, l2) in the output addition circuits 392k, the n output control circuit 391j performing the output control process as a process allowing output of (k−1)/2 signals for each of phase positions defined by a modulus of n and located on opposite sides of a phase position at which the corresponding sub-quotient position signals 10rj is js.

Each output addition circuit $392k$ (k=11, 12) is configured to designate k, perform an addition process on the set of n selected tangent signals $39jk$ (j=0, n−1) supplied for k, and output the resultant addition signal (continuous tangent signal) $10sk$.

Using FIG. 12, details of the configuration of the tangent signal output circuit 39 will be described by exemplarily referring to a case where the desired number k is 5. Tangent signals are useful only when they are near the sub-principal value position js. The tangent signal output circuit 39 thus outputs a set of tangent signals near the sub-principal value position js. Since the sub-quotient position signals other than js are "0", addition is simply performed across j.

In this embodiment, an example of outputting a total of five adjacent signals centered at js will be presented. Each output control circuit $391j$ includes multiplication circuits $391jk$ configured to multiply the set of signals $391pjk$ supplied from a set of terminals $39al$ (j=0, n−1) to a set of terminals $391ajk$ (k=−2, +2) by the signal $10rj$, and output the set of signals $39jk$ thus obtained by performing the output control process to the output addition circuits $392k$, where l=mod(j+k, n). Each output addition circuit $392k$ (k=−2, +2) performs an addition process on the set of signals $39jk$ (j=0, n−1) and outputs the signal $10sk$.

Figure 13A:
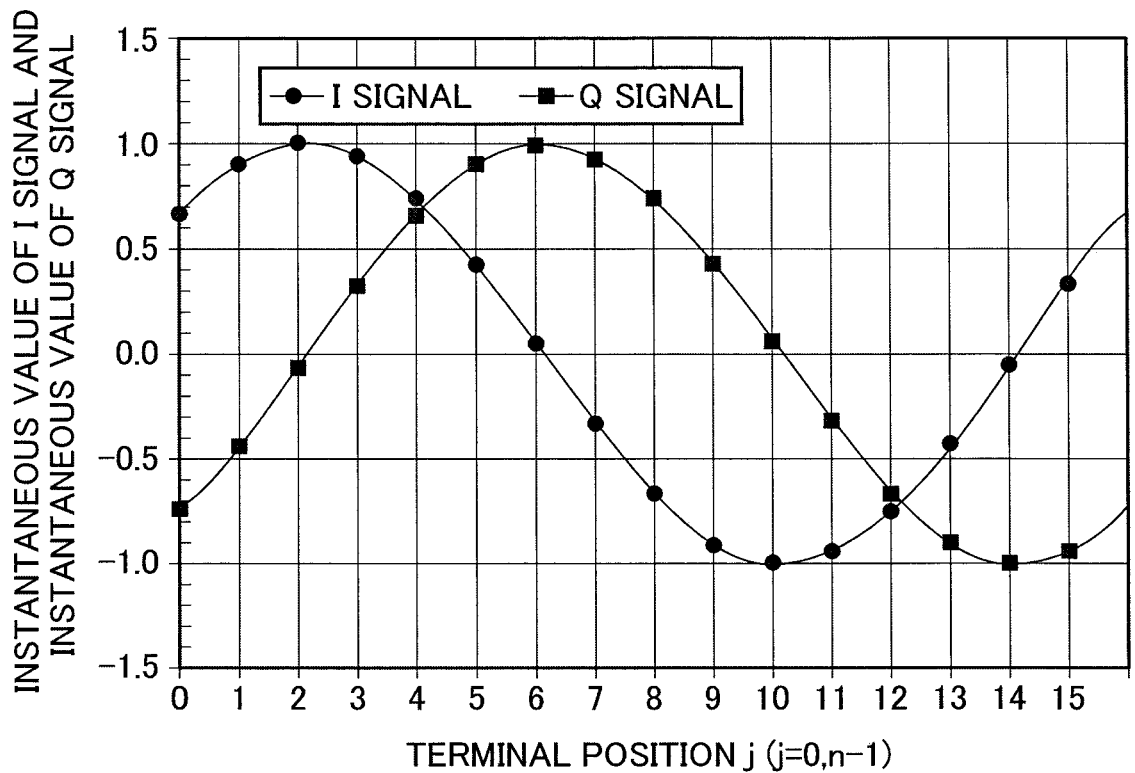
FIGS. 13A and 13B are an explanatory diagram of the operation of the phase discrete continuous measurement circuit in embodiment 3.

Next, the operation of the phase discrete continuous measurement circuit 30 will be described using FIGS. 13A and 13B. Using FIG. 13A, the operation of detecting the sub-principal value position will be described by exemplarily referring to a case where the sub-principal value position js is "2". This operation is characterized in that it is performed simultaneously for all the terminal positions j in parallel. Note that since the number n by which a phase of $2\pi$ is divided is 16, the terminal position 16 is the same as the terminal position 0.

The operation at each position j is performed by the following detection circuits and so on. First, the sign detection circuit 371 detects that the sign of the I signal at its terminal position (js=2) is positive, and the comparison circuit 374 detects that the amplitude of the I signal at its terminal position is larger than the amplitude of the Q signal at its terminal position. Also, the smallest amplitude detection circuit 380 detects that the amplitude of the Q signal at its terminal position (js=2) is smaller than any of the amplitude of the Q signal at the terminal position adjacent to its terminal position (js−1) and the amplitude of the Q signal at the terminal position adjacent to its terminal position (js+1). The different sign detection circuit 3810 detects that the sign of the tangent signal or Q signal at the terminal position adjacent to the its terminal position (js−1) and the sign of the tangent signal or Q signal at the terminal position adjacent to the its terminal position (js+1) are opposite from each other.

The sub-principal value position js is determined when the multiplication circuit 390 and the multiplication circuit 361 detect that the above two detection states as sub-quotient position determining conditions are both met. As the result of such determination, signals "1" and "0" are output in parallel such that the signal "1" is output only for js among the n terminal positions j and the signal "0" is output for the other terminal positions.

Note that although the illustrated embodiment has exemplarily presented the case where the input signals into the smallest position detection circuit 38 are tangent signals, the determination result will be the same even if a total of three signals including the Q signal at its position and the two Q signals adjacent to its position are used.

Figure 13B:
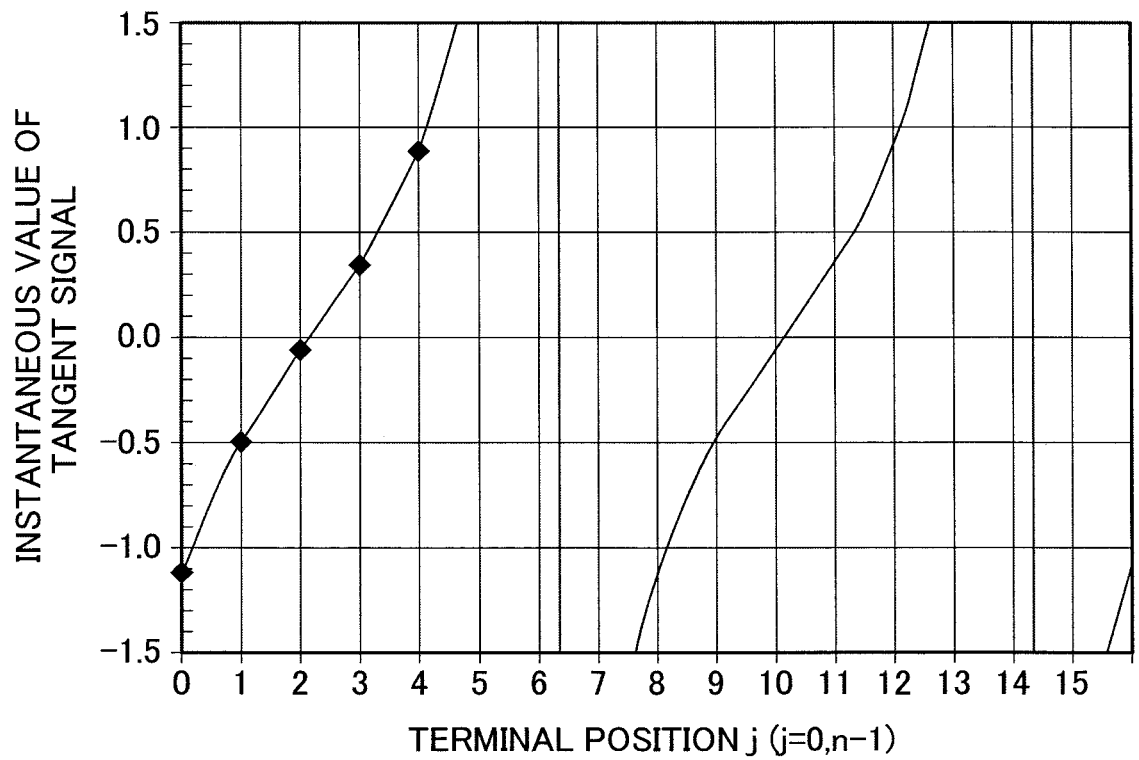

In FIG. 13B the set of five tangent signals at the five points centered at the sub-principal value position js (j=2), namely (js−2), (js−1), js, (js+1), and (js+2) are illustrated with marks. FIG. 13B exemplarily illustrates the case where the set of tangent signals at the five points centered at the sub-principal value position js is output by the process of the tangent signal output circuit 39.

Next, advantageous effects of the phase analysis circuit 10 will be described. That the parallel phase shift circuit 20 and the phase discrete continuous measurement circuit 11 constantly enable instantaneous phase measurement will be described using FIGS. 14A and 14B.

A numerical simulation is performed in which the type of circuit used in the simulation is the circuit illustrated in FIG. 1, which is the phase analysis circuit 10. As for conditions of the numerical simulation, the frequency of the input signal pair is 2.4992 GHz. The frequency of the set of multi-phase separation frequency signal pairs is a fixed value of 2.5 GHz. The frequency of the input signal pair is set to a frequency lower by 800 kHz, which is n (=16) times a frequency discrete analysis interval of 50 kHz, which is one application example of the present invention. Since the number n of pairs in the set of multi-phase separation frequency signal pairs is 16, the phase analysis interval is equal to division of $2\pi$ by 16, or $2\pi/16$ (22.5°). Here, the frequency of the set of phase-shifted orthogonal signal pairs $20rIQj$ in FIG. 2 is 800 kHz.

Figure 14B:
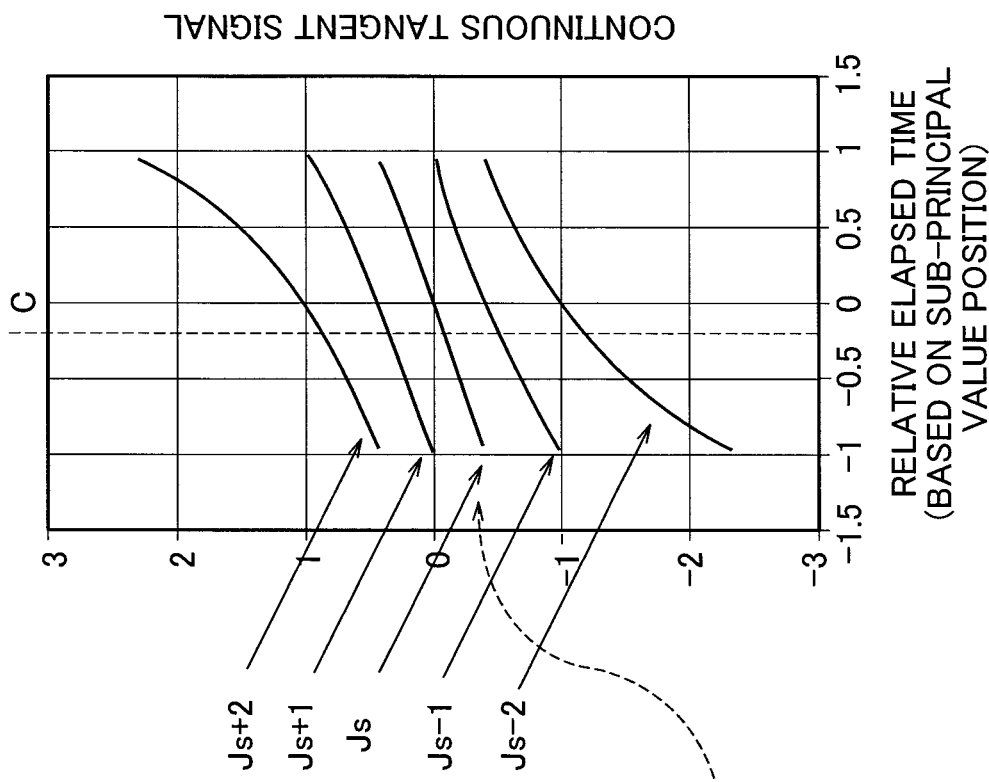
FIGS. 14A and 14B are a diagram illustrating an exemplary simulation of time-series changes of discrete values and interpolative continuous values in output signals from the phase discrete continuous measurement circuit in embodiment 3.
Figure 14A:
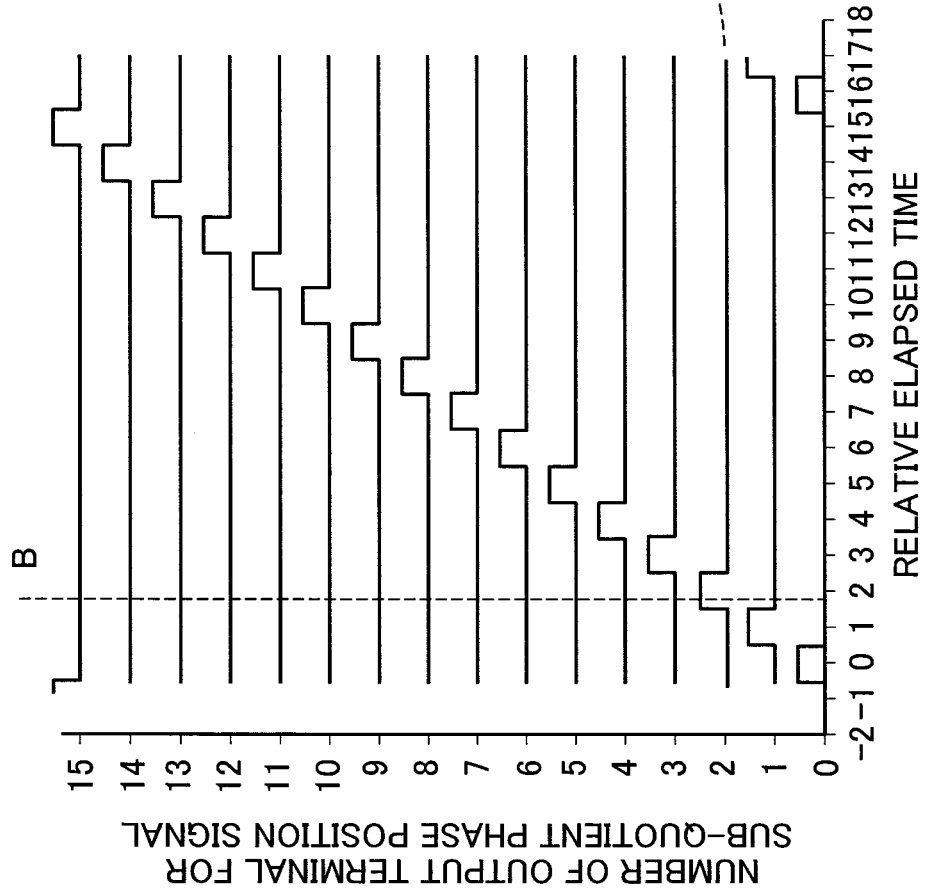

FIG. 14A illustrates the result of a discrete analysis obtained by performing the simulation under the above conditions. The horizontal axis represents relative elapsed time scaled at intervals of an elapsed time of 78.125 nsec, obtained by dividing 1.25 μsec, or the time taken for the phase of an 800-kHz signal to change over $2\pi$, by 16. The vertical axis represents the set of signals $30rj$ that appear at a set of terminals $30cj$ in FIG. 5. The terminal at the sub-quotient phase position j at which the sub-quotient phase value is the smallest value outputs a signal of "1". The output signals from the other terminals are "0". This set of signals is referred to as the set of discrete signals.

For example, a time B indicated by the vertical dotted line is characterized in that only the signal with the output terminal number "2" is "1" while all the signals with the other terminal numbers are "0". This terminal number indicating "1" is referred to as the sub-principal value position js. This sub-principal value position js moves in a discrete manner with the elapse of time. Meanwhile, the dotted line B corresponds to the position of the arrow A in FIG. 4.

Next, "effect of separation and high-speed detection", which are the first advantageous effect, will be described. As illustrated in FIG. 14A, the sub-principal value position js, at which the output signal is "1", always appears at one of the 16 output terminals, which output their output signals in parallel, each time 1.25 μsec elapses, in particular the terminal whose output signal has the smallest value. This sub-principal value position js represents a remainder phenomenon in which a phase of $2\pi$ is a modulus. For this reason, the sub-principal value position js appears repeatedly, and further the time for which the output signal from this terminal is maintained at "1" is 78.125 nsec.

This means that the discrete analysis time is $1/n^2$, or $1/256$, of 20 μsec, which is one period of 50 kHz, or the frequency discrete analysis interval, that is, a high-speed decomposition effect is achieved. Since there is the remainder phenomenon for the phase, in which $2\pi$ is a modulus, a plurality of settings are possible for the setting of the 800-kHz frequency difference.

Further, the accuracy of the decomposition at a high speed of 78.125 nsec means that there is a phase separation effect that can be directly associated with the set of multi-phase separation frequency signal pairs j supplied as reference signals from the multi-phase separation frequency signal pair set supply circuit 2. Hence, it is possible to perform precise measurement with precision obtained by dividing a phase of $2\pi$ by n.

The continuous tangent signals 30*dk*, which are a second advantageous effect, will be described, and their relation with the set of discrete signals will be then be described. The set of continuous tangent signals are analysis output signals that cannot be obtained by discrete analysis methods with conventional techniques such as FFT.

Figure 5:
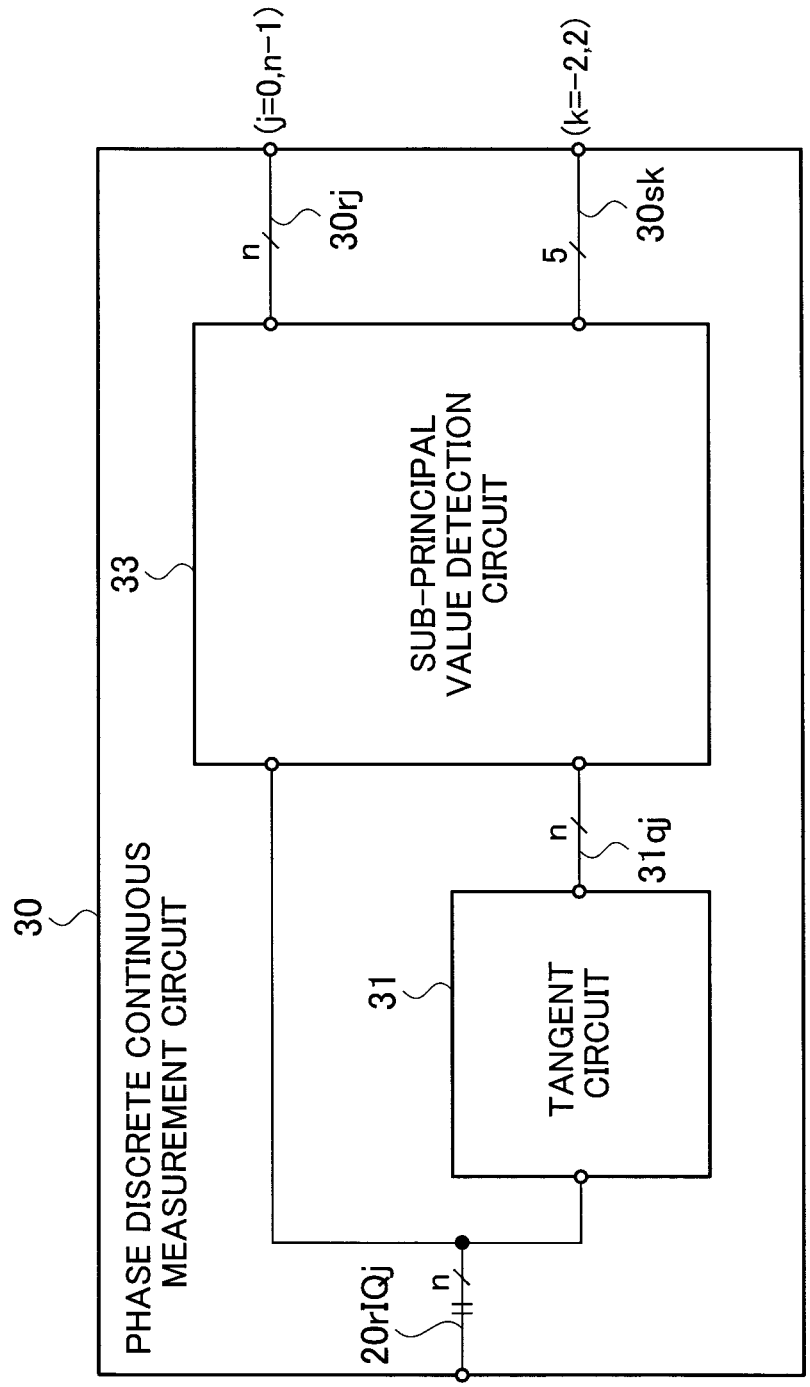
FIG. 5 is a block diagram of a phase discrete continuous measurement circuit in embodiment 3.

FIG. 14B illustrates the result of a simulation of the set of continuous tangent signals 30*sk* (k=−2, 2) as the result of a continuous analysis that appears at a set of terminals 30*ck* in FIG. 5. The horizontal axis represents relative elapsed time which is based on the separated phases of a set of phase separation frequency signal pair 2*p*IQj at the sub-principal value positions js illustrated in FIG. 14A. The time B in FIG. 14A corresponds to a time C in FIG. 14B.

The five curves correspond to the suffixes k of terminal positions and are js−2, js−1, js, js+1, and js+2 in this order from bottom to top. The purpose of outputting the five continuous tangent signals is to utilize the accurate separation effect provided by the set of multi-phase separation frequency signal pairs in the lending-borrowing process and the like with the discrete signals in the calculation of the phase difference at different times.

Next, the relation between the set of discrete signals and the set of continuous tangent signals will be described. The sum value of the set of continuous tangent signals 30*sk* (k=−2, 2) and the sub-quotient phases 30*rj* corresponding thereto in terms of phase is essentially continuous at the moments of transition between the sub-quotient phase 30*rj* (j=j) and the adjacent sub-quotient phases 30*rj* (j=j±1) (transitional moments). This continuous phenomenon is characterized in that the continuity is essentially satisfactory even when the transition time changes due to jitter and circuit constant variation.

Next, non-dependency on amplitude, which is a third advantageous effect, will be described. The sub-principal value position js to be analyzed in the present invention is characterized in that it is a relative comparison process between parallel signals generated from n phase-shifted orthogonal signal pairs output in parallel and is therefore not directly dependent on changes in amplitude of the input signals.

The above description has been given by exemplarily referring to the case illustrated in FIG. 4 in embodiment 2 where a phase of $2\pi$ is divided by a number of 16 and is divided evenly. However, the present invention is not limited to even division. In other words, it should be noted that the advantageous effects intended by the present invention will not be impaired even if uneven division is employed. This is because the circuit processing does not use even division as a condition.

Embodiment 4

An IQ addition phase measurement circuit 40 in embodiment 4 discloses the phase discrete continuous measurement circuit 11 additionally including an IQ signal addition circuit 41 configured to perform ensemble addition of the mutually orthogonal signals in the set of phase-shifted orthogonal signal pairs to be supplied to the phase discrete continuous measurement circuit 30 described in embodiment 3.

In this case, an even separation method is employed in which the phase difference between one signal in each mutually orthogonal signal pair in the set of phase-shifted orthogonal signal pairs, e.g. the signal 20*r*Ij, and each signal with the next value of j is set substantially to a value obtained by dividing $2\pi$ by n.

Since the IQ signal addition circuit 41 is an ensemble addition circuit under this condition, it is possible to reduce the influence of circuit constant variation, jitter, white noise, and the like without causing increase in measurement time proportional to the number of additions. Further, the values of the phase-shifted orthogonal signal pairs after the addition increase by the number of additions. Consequently, it is possible to achieve an improved signal-to-noise ratio above the number of additions.

The phase discrete continuous measurement circuit 30 described in embodiment 3 will also be referred to as the basic-type phase discrete continuous measurement circuit 30 to distinguish it.

Figure 15:
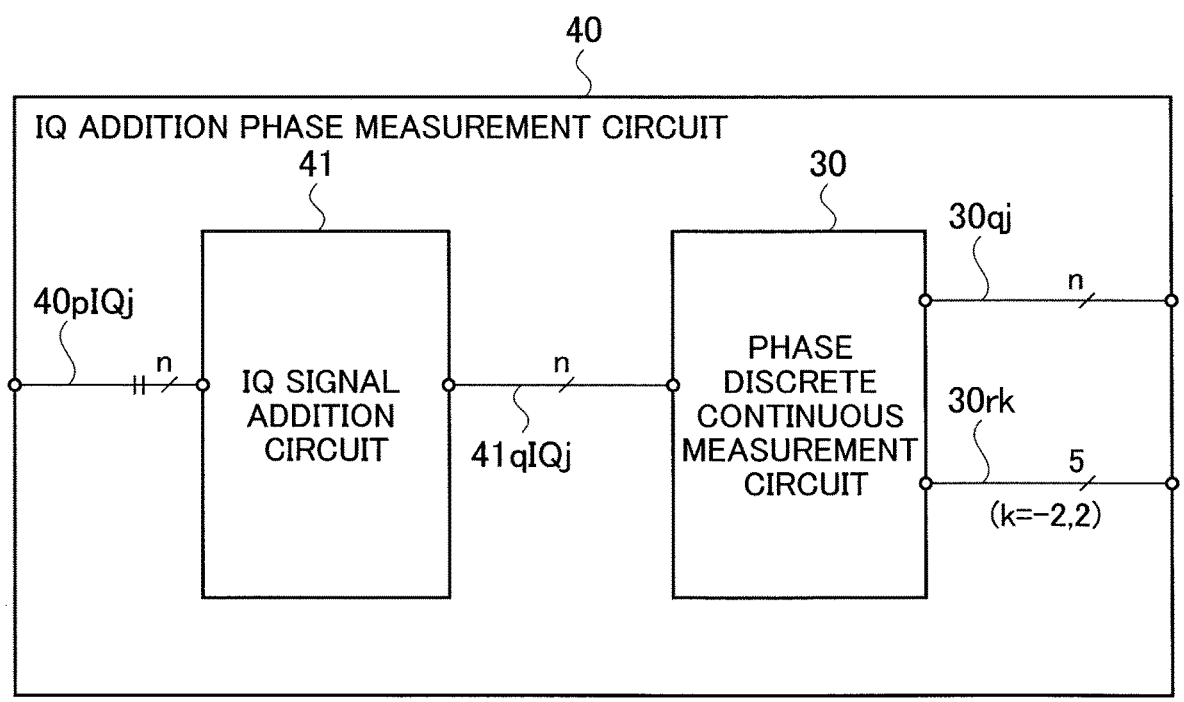
FIG. 15 is a block diagram of an IQ addition phase measurement circuit in embodiment 4.

The IQ addition phase measurement circuit 40 illustrated in FIG. 15 includes the IQ signal addition circuit 41 and the basic-type phase discrete continuous measurement circuit 30. The IQ signal addition circuit 41 is configured to perform a four-quadrant IQ signal addition process on a set of phase-shifted orthogonal signal pairs 40*p*IQj and output a resultant set of added phase-shifted orthogonal signal pairs 41*q*IQj to the phase discrete continuous measurement circuit 30. The phase discrete continuous measurement circuit 30 is configured to perform a phase discrete continuous measurement process on the set of added phase-shifted orthogonal signal pairs 41*q*IQj from the IQ signal addition circuit 41, and outputs a resultant set of discrete signals 30*qj* and a resultant set of continuous tangent signals 30*rk*.

Figure 16:
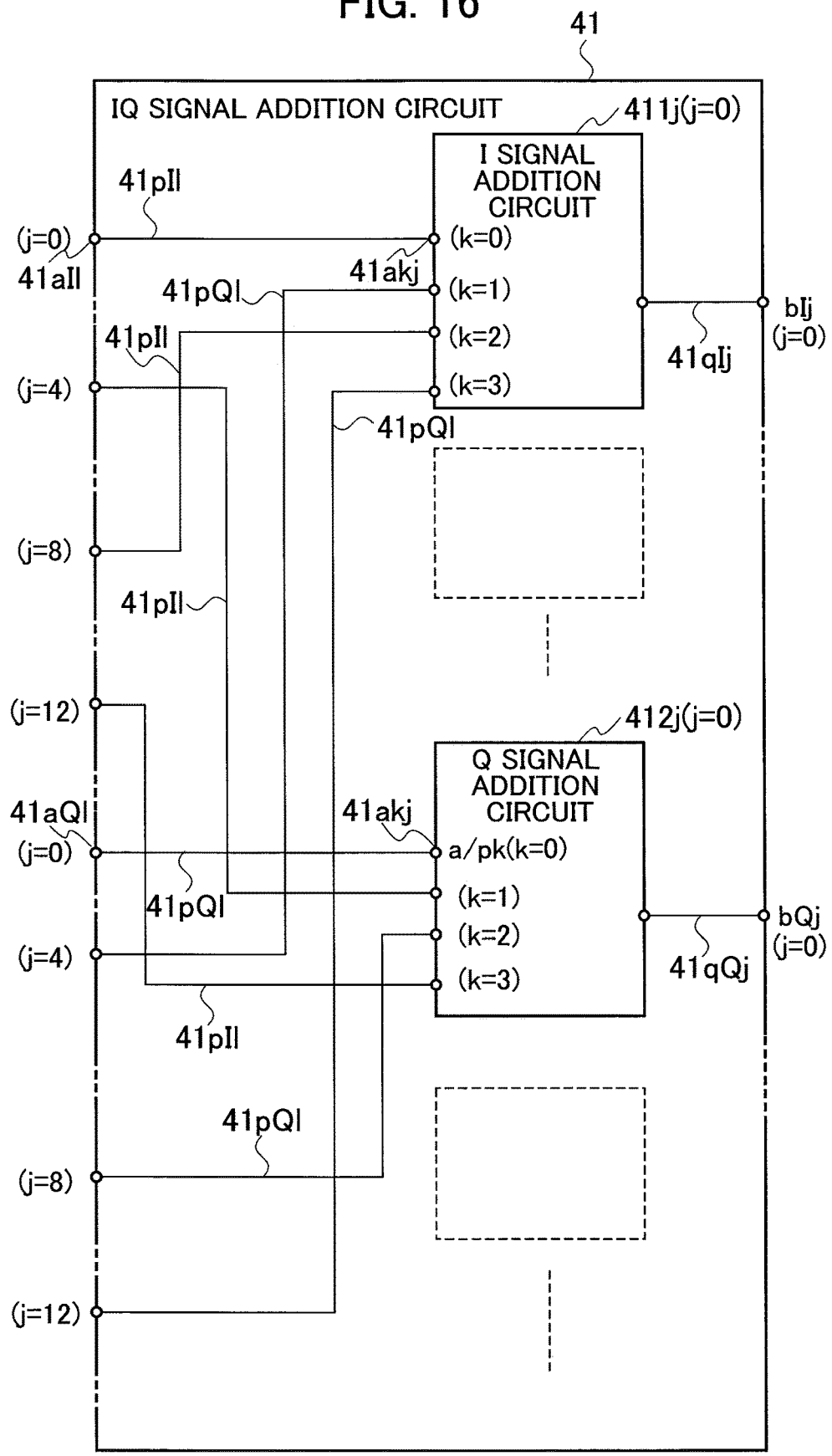
FIG. 16 is a block diagram of an IQ signal addition circuit in embodiment 4.

Focusing on the phenomenon in which the set of phase-shifted orthogonal signal pairs 40*p*IQj repeats four times over the four quadrants of a phase of $2\pi$, the IQ signal addition circuit 41 illustrated in FIG. 16 selects designated four signals and outputs a sum signal of these four. Consequently, the set of phase-shifted orthogonal signal pairs increases in magnitude of amplitude, thereby making it possible to reduce the influence of circuit constant variation contained in the set of phase-shifted orthogonal signal pairs, the influence of the jitter and noise contained in the signals, and the like.

In FIG. 16, the I signals 40*p*I and the Q signals 40*p*Qj in the phase-shifted orthogonal signal pairs 40*p*IQj are illustrated to be separated to the upper side and the lower side with changing suffixes j. The IQ signal addition circuit 41 includes n I signal addition circuits 411*j* of an autonomous distributed processing type each configured to output the j-th added one signal, and n Q signal addition circuits 412*j* of an autonomous distributed processing type each configured to output the j-th added other signal. Each I signal addition circuit 411*j* adds together a signal 40*p*Il supplied from a terminal 41*a*Il to a terminal 41*akj* (k=0), a signal 41*p*Ql supplied from a terminal 41*a*Ql to a terminal 41*akj* (k=1), a signal 41*p*Il supplied from a terminal 41*a*Il to a terminal 41*akj* (k=2), and a signal 41*p*Ql supplied from a terminal 41*a*Ql to a terminal 41*akj* (k=3) to each other, where l=mod(j+k*n/4, n). The I signal addition circuit 411*j* then outputs a resultant added one signal 41*q*Ij in an added phase-shifted orthogonal signal pair.

Each Q signal addition circuit 412*j* adds together a signal 41*p*Ql supplied from a terminal 41*a*Ql to a terminal 41*akj* (k=0), a signal 41*p*Il supplied from a terminal 41*a*Il to a terminal 41*akj* (k=1), a signal 41*p*Ql supplied from a terminal 41*a*Ql to a terminal 41*akj* (k=2), and a signal 41*p*Il supplied from a terminal 41*a*Il to a terminal 41*akj* (k=3) to each other, where l=mod(j+k*n/4, n). The Q signal addition circuit 412*j* then outputs a resultant added other signal 41*q*Qj in an added phase-shifted orthogonal signal pair.

The process of "adding" will be described next in detail.

Figure 17:
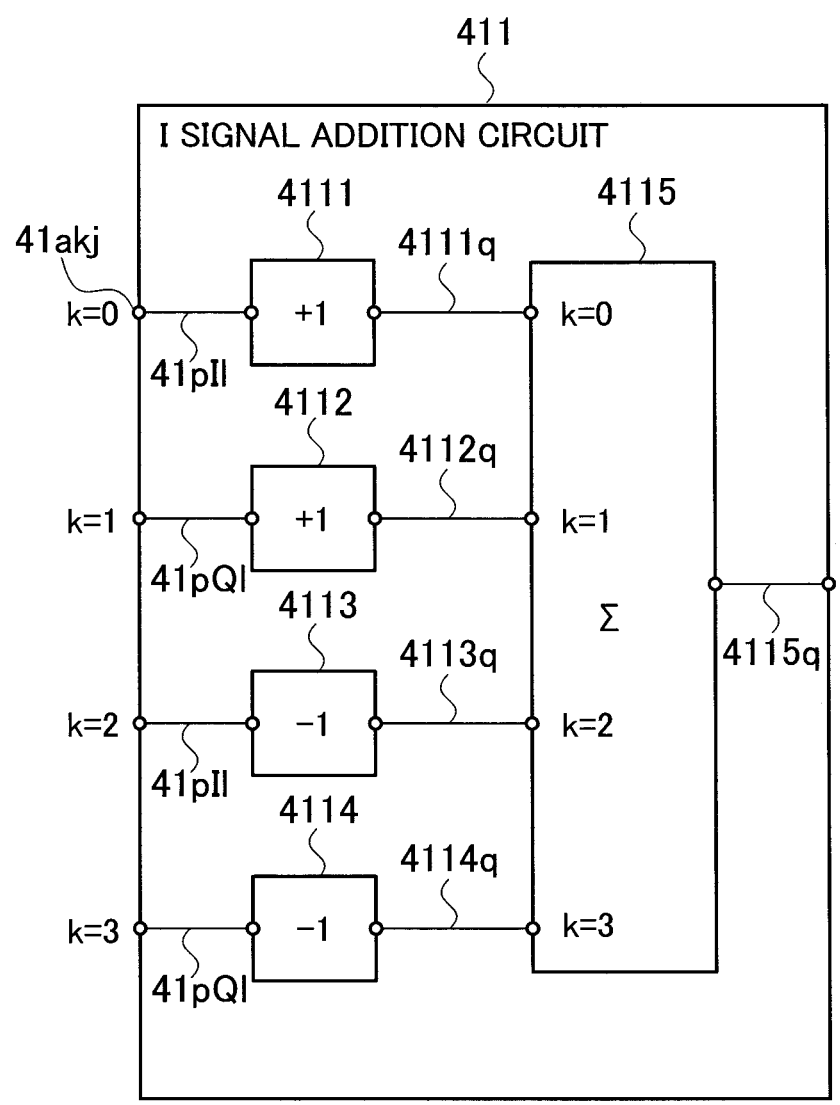
FIG. 17 is a block diagram of an I signal addition circuit in embodiment 4.

The I signal addition circuit 411 illustrated in FIG. 17 includes a first sign non-inversion circuit 4111, a second sign non-inversion circuit 4112, a first sign inversion circuit 4113, a second sign inversion circuit 4114, and a signal addition circuit 4115. The first sign non-inversion circuit 4111 is configured to perform a sign non-inversion process on the signal 41*p*Il (k=0) supplied to the terminal 41*akj* (k=0) and output a resultant signal 4111*q* to the signal addition circuit 4115. The second sign non-inversion circuit 4112 is configured to perform a sign non-inversion process on the signal 41*p*Ql (k=1) supplied to the terminal 41*akj* (k=1) and output a resultant signal 4112*q* to the signal addition circuit 4115. The first sign inversion circuit 4113 is configured to perform a sign inversion process on the signal 41*p*Il (k=2) supplied to the terminal 41*akj* (k=2) and output a resultant signal 4113*q* to the signal addition circuit 4115. The second sign inversion circuit 4114 is configured to perform a sign inversion process on the signal 41*p*Ql (k=3) supplied to the terminal 41*akj* (k=3) and output a resultant signal 4114*q* to the signal addition circuit 4115. The signal addition circuit 4115 is configured to summate the signal 4111*q* from the first sign non-inversion circuit 4111, the signal 4112*q* from the second sign non-inversion circuit 4112, the signal 4113*q* from the first sign inversion circuit 4113, and the signal 4114*q* from the second sign inversion circuit 4114 and output a resultant signal 4115*q*.

Figure 18:
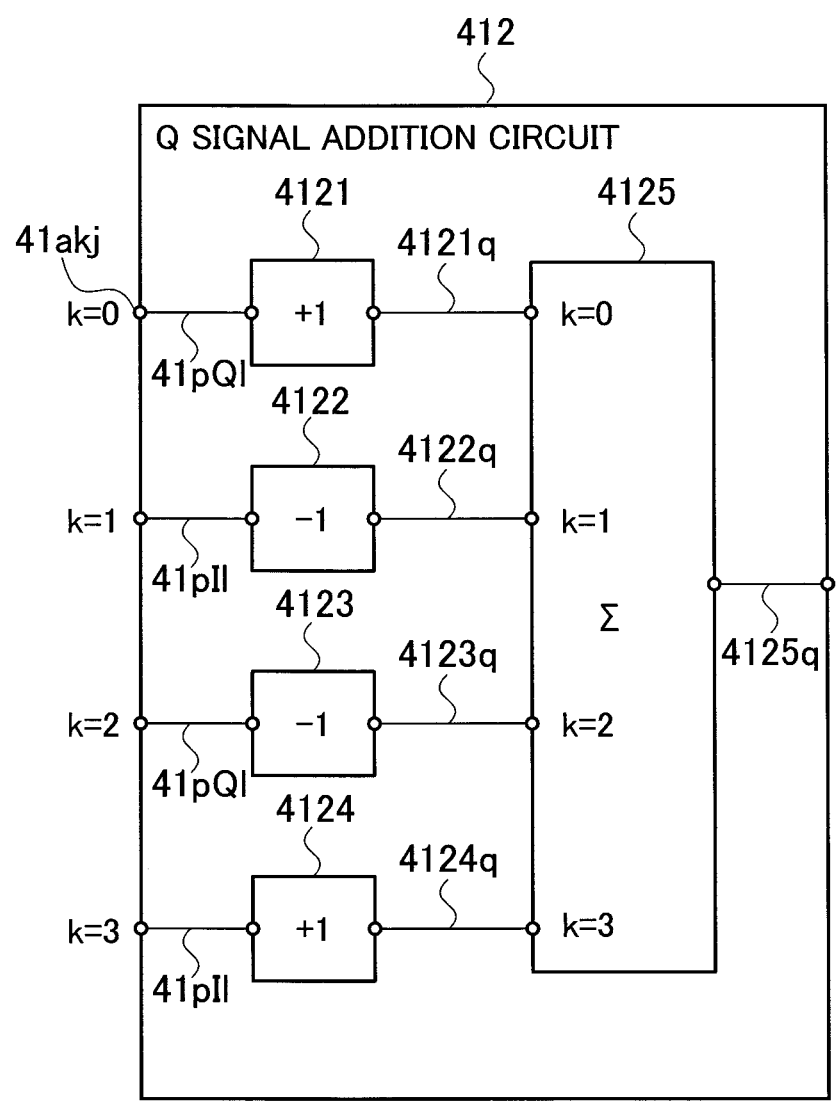
FIG. 18 is a block diagram of a Q signal addition circuit in embodiment 4.

The Q signal addition circuit 412 illustrated in FIG. 18 includes a first sign non-inversion circuit 4121, a second sign inversion circuit 4122, a first sign inversion circuit 4123, a second sign non-inversion circuit 4124, and a signal addition circuit 4125. The first sign non-inversion circuit 4121 is configured to perform a sign non-inversion process on the signal 41*p*Ql (k=0) supplied to the terminal 41*akj* (k=0) and output a resultant signal 4121*q* to the signal addition circuit 4125. The second sign inversion circuit 4122 is configured to perform a sign inversion process on the 41*p*Il (k=1) supplied to the terminal 41*akj* (k=1) and output a resultant signal 4122*q* to the signal addition circuit 4125. The first sign inversion circuit 4123 is configured to perform a sign inversion process on the signal 41*p* (k=2) supplied to the terminal 41*akj* (k=2) and output a resultant signal 4123*q* to the signal addition circuit 4125. The second sign non-inversion circuit 4124 is configured to perform a sign non-inversion process on the signal 41*p*Il (k=3) supplied to the terminal 41*akj* (k=3) and output a resultant signal 4124*q* to the signal addition circuit 4125. The signal addition circuit 4125 is configured to summate the signal 4121*q* from the first sign non-inversion circuit 4121, the signal 4122*q* from the second sign inversion circuit 4122, the signal 4123*q* from the first sign inversion circuit 4123, and the signal 4124*q* from the second sign non-inversion circuit 4124 and output a resultant signal 4125*q*.

Note that it is desirable that the gains between the inputs and the outputs of the two sign non-inversion circuits and the two sign inversion circuits be substantially equal. Also, it is desirable that the gains between the four input terminals and the output terminal of the summation circuit be substantially equal.

The IQ signal addition circuit 41 can also be expressed as including an I signal addition circuit and a Q signal addition circuit. The IQ signal addition circuit 41 includes: a set of to-be-added I signal input terminals into which to input a set of to-be-added I signals that are one signals among the mutually orthogonal signals in n to-be-added phase-shifted orthogonal signal pairs; a set of to-be-added Q signal input terminals into which to input a set of to-be-added Q signals that are the other signals among the mutually orthogonal signals in the n to-be-added phase-shifted orthogonal signal pairs; a set of added I signal output terminals from which to output a set of added I signals that are one signals among the mutually orthogonal signals in n added phase-shifted orthogonal signal pairs; and a set of added Q signal output terminals from which to output a set of added Q signals that are the other signals among the mutually orthogonal signals in the n added phase-shifted orthogonal signal pairs. The IQ signal addition circuit 41 includes: n difference signals (set of first difference signals) of n signal pairs (first pairs) in the set of to-be-added I signals at positions shifted from each other by 180°; n difference signals (set of second difference signals) of n signal pairs (second pairs) in the set of to-be-added Q signals at positions shifted from each other by 180°; a set of difference signals (set of third difference signals) of third pairs at positions shifted from the first pairs by 90°; and a set of difference signals (set of fourth difference signals) of fourth pairs at positions shifted from the second pairs by 90°. The I signal addition circuit includes n addition-subtraction circuits configured to output one of a set of addition signals and a set of subtraction signals of the set of first difference signals and the set of third difference signals. The Q signal addition circuit includes n addition-subtraction circuits configured to output the other of a set of addition signals and a set of subtraction signals of the set of second difference signals and the set of fourth difference signals. Note that a "position shifted by 90°" means a "cotangent signal" with respect to a tangent signal, for example.

Next, the operation will be described using FIG. 19. The horizontal axis represents the terminal numbers j. The horizontal axis does not represent the elapse of time. At a given time, signals simultaneously appear in parallel at n sets of 2n terminals. This is the basis principle of the increasing of processing speed throughout the present invention, and the effect of the parallel phase shift circuit 20 described in embodiment 2. The vertical axis illustrates n pairs of I signals (black circular marks connected by a solid line) and Q signals (black square marks connected by a solid line) constituting a set of phase-shifted orthogonal signal pairs at a given time, and n pairs of −I signals (white circular marks connected by a dotted line) and −Q signals (while square marks connected by a dotted line) generated by the four-quadrant IQ signal addition circuit 41 via sign inversion. Here, the phases of the orthogonal input signal pairs (20*p*IQ) represent the phase of the input signal illustrated by the arrow A in FIG. 4.

Figure 19:
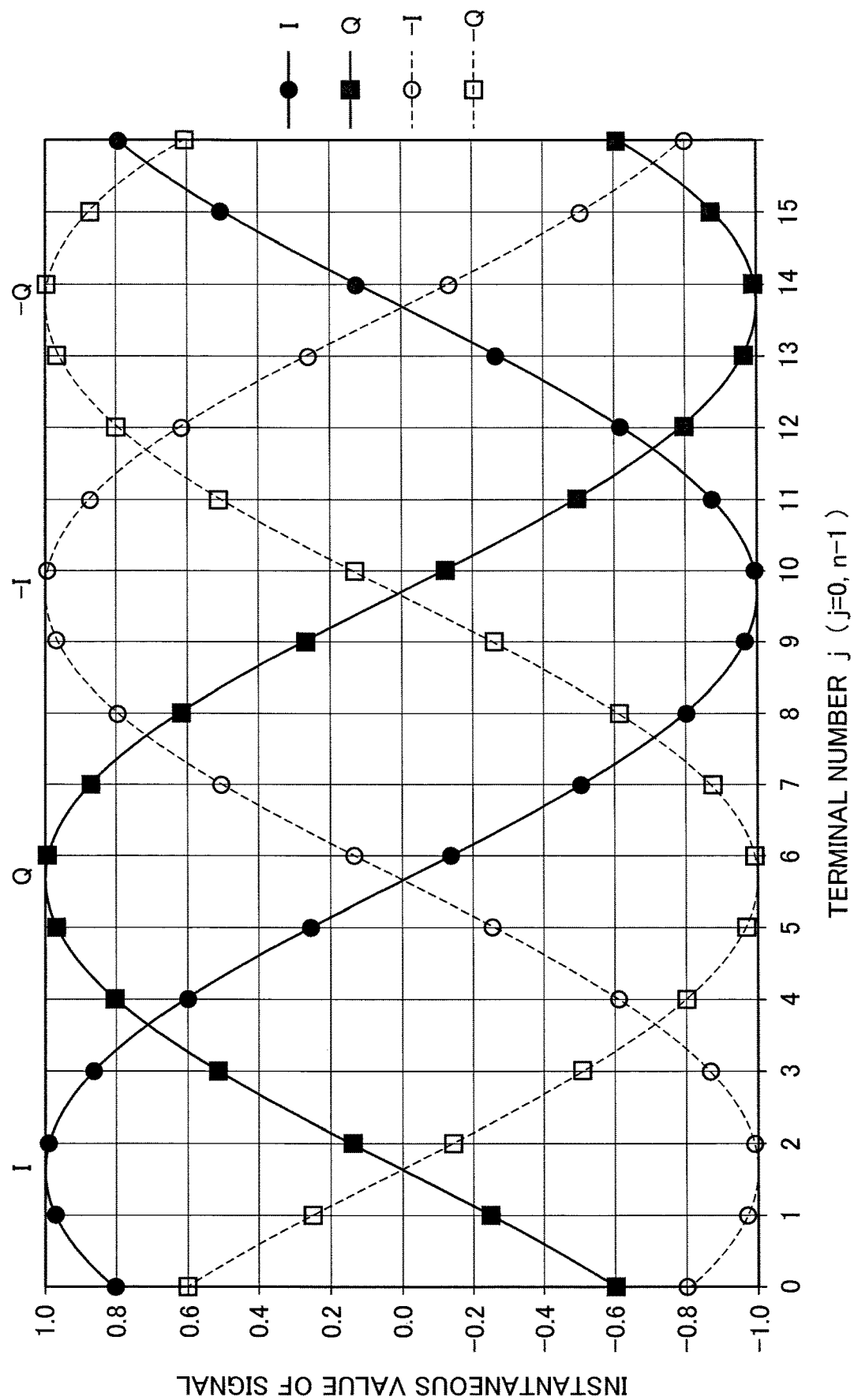
FIG. 19 is an explanatory diagram of the operation of the IQ signal addition circuit in embodiment 4.

Also, to implement the remainder effect in which a phase of 2π is a modulus, there are a plurality of combinations of the frequency of the input signal pair and the frequency of the set of multi-phase separation frequency signal pairs as illustrated in FIG. 19.

Next, the advantageous effects will be described. The number of ensemble additions at the IQ signal addition circuit 41 is "4" since the addition is performed across the four quadrants. The IQ signal addition circuit 41 is constituted of sign non-inversion circuits, sign inversion circuits, and summation circuits. What is characteristic is that the output amplitude is the sum of the amplitudes before the addition for all terminals. The following advantageous effects can therefore be expected.

Since four signals with the same values are added together, the signal amplitude quadruples. Also, the addition process can reduce the influence of circuit constant variation, jitter, and white noise and thereby improve the noise tolerance. Similar advantageous effects can be expected also when the number of phase discrete analyses is increased from n=16 to n=32, for example.

Embodiment 5

A phase check circuit 50 in embodiment 5 includes the phase analysis circuit 10 described in embodiments 1 to 4 and a frequency conversion orthogonal decomposition circuit 51. The phase check circuit 50 is configured to receive the set of multi-phase separation frequency signal pairs j used in embodiment 1, which is a set of first external base reference signal pairs, and further receive at least one pair in a set of multi-frequency separation frequency signal pairs, which are second external base reference signal pairs.

The frequency conversion orthogonal decomposition circuit 51 is configured to generate a signal pair having a beat frequency and supply the generated signal pair to input terminals of the phase analysis circuit 10. This beat frequency is not a zero-beat frequency as in setting examples in conventional technique examples, but covers a range within which it may be set to a frequency higher than the frequency of an input signal 50p.

Thus, what is characteristic is that bandpass filtering circuits are used instead of low-pass filtering circuits as frequently used in conventional techniques. The present invention uses bandpass filtering circuits with as high a center frequency as possible.

A "precursor phenomenon" in a bandstop filtering circuit, which is a time in which the output signal does not start to be output, also occurs in a bandpass filtering circuit. The phase instantaneous measurement method of the present invention outputs a processing result instantaneously. Then, the only cause of a lag in the whole circuit is the filtering circuit and dominates the performance of the whole.

Figure 20:
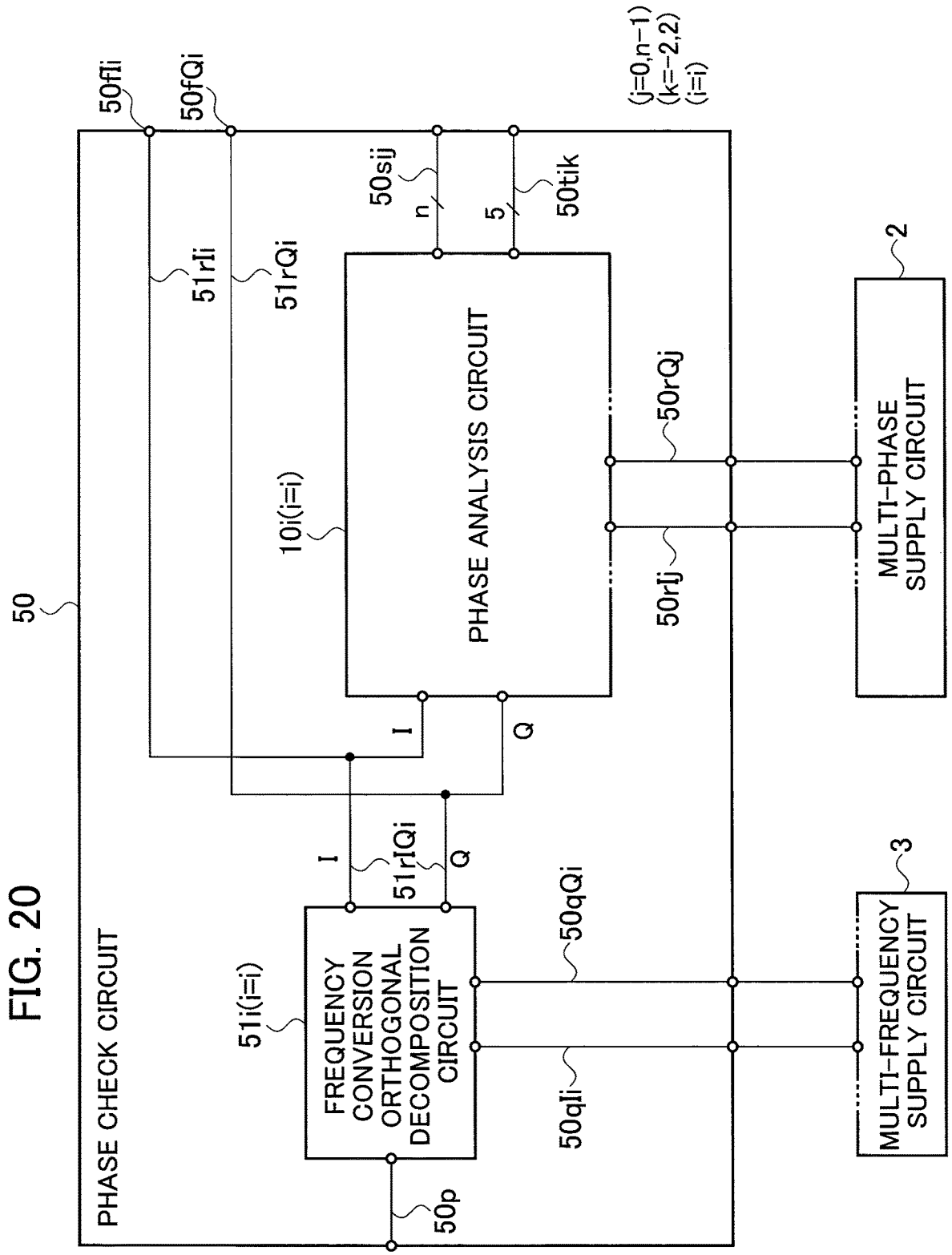
FIG. 20 is a block diagram of a phase check circuit in embodiment 5.

The configuration of the phase check circuit 50 will be described below using FIG. 20. The multi-phase supply circuit 2 and a multi-frequency separation frequency signal pair set supply circuit 3 (abbreviated as the multi-frequency supply circuit 3) are connected to the phase check circuit 50. The phase check circuit 50 receives the input signal 50p to be evaluated, receives a one signal 50qIi (i=i) and the other signal 50qQi (i=i), mutually orthogonal to each other, in at least one desired signal pair 50qIQi (i=i) in a set of multi-frequency separation frequency signal pairs, receives a set of one signals 50rIj and a set of the other signals 50rQj, orthogonal to each other, in a set of n multi-phase separation frequency signal pairs 50rIQj dividing a phase of $2\pi$ by n, and outputs a set of discrete signals 50sij (i=i) (j=0, n−1) and a set of continuous tangent signals 50tik (i=i) (k=−2, +2).

The phase check circuit 50 includes a frequency conversion orthogonal decomposition circuit 51i (i=i) and a phase analysis circuit 10i (i=i). The frequency conversion orthogonal decomposition circuit 51i (i=i) is configured to perform a frequency conversion orthogonal decomposition process on the signal 50p based on the signal pair 50qIQi from the multi-frequency supply circuit 3 and output a resultant orthogonal signal pair 51rIQi (i=i) to the phase analysis circuit 10i and terminals 50fIj and 50fQj. The phase analysis circuit 10i (i=i) is configured to perform an instantaneous phase discrete continuous analysis process based on the orthogonal signal pair 51rIQi (i=i) and the set of signal pairs 50rIQj, and output a resultant set of discrete signals 50sij (i=i) (j=0, n−1) and a resultant set of continuous tangent signals 50tik (i=i) (k=−2, +2).

Figure 21:
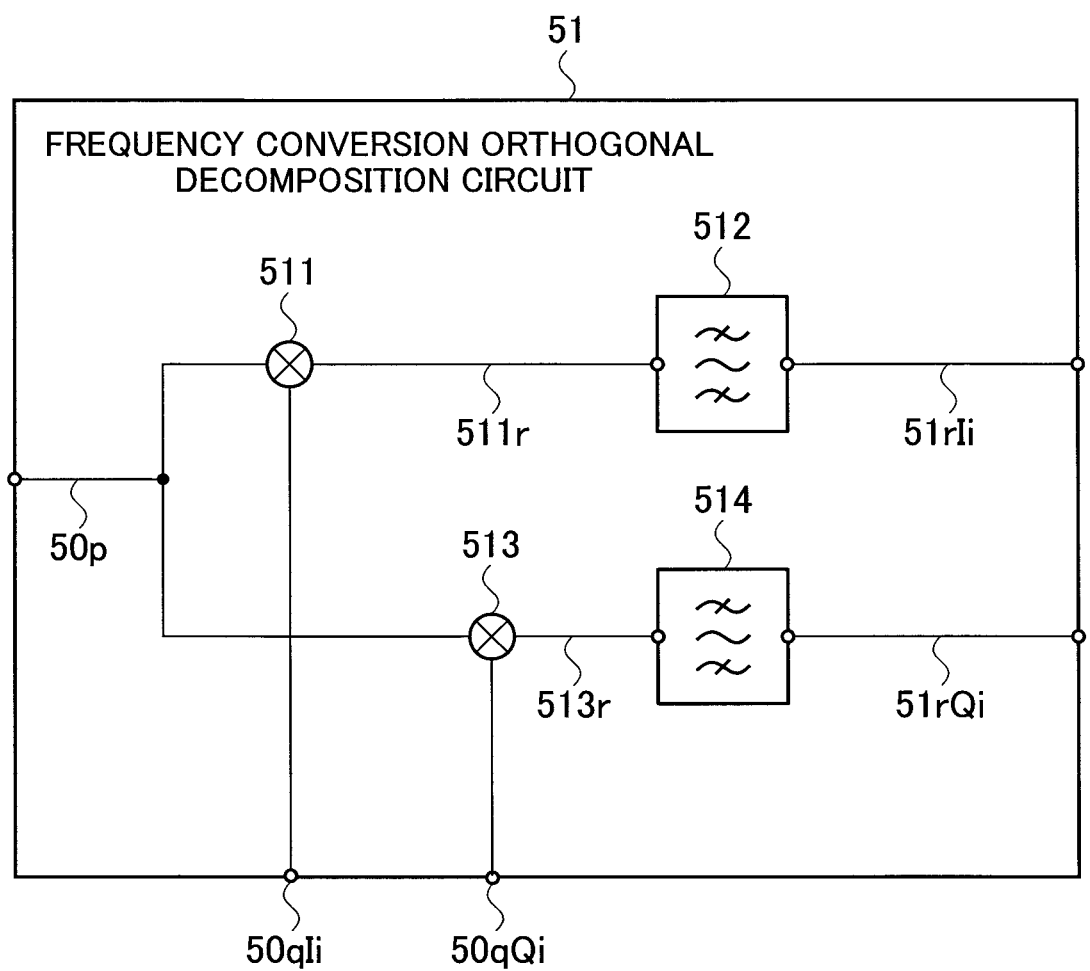
FIG. 21 is a block diagram of a frequency conversion orthogonal decomposition circuit in embodiment 5.

The frequency conversion orthogonal decomposition circuit 51 illustrated in FIG. 21 includes a first multiplication circuit 511, a first bandpass filtering circuit 512, a second multiplication circuit 513, and a second bandpass filtering circuit 514. The first multiplication circuit 511 is configured to multiply the signal 50p by the signal 50qIi and output a resultant signal 511r to the first bandpass filtering circuit 512. The first bandpass filtering circuit 512 is configured to perform a bandpass filter process on the signal 511r from the first multiplication circuit 511 and output a resultant signal 51rIj (one quadrature detection signal). The second multiplication circuit 513 is configured to multiply the signal 50p by the signal 50qQi and output a resultant signal 513r to the second bandpass filtering circuit 514. The second bandpass filtering circuit 514 is configured to perform a bandpass filter process on the signal 513r from the second multiplication circuit 513 and output a resultant signal 51rQj (the other quadrature detection signal).

Meanwhile, the frequency conversion orthogonal decomposition circuit 51 can also be expressed as including a first bandpass filter circuit and a second bandpass filter circuit. The first bandpass filter circuit is configured to output one of a difference frequency signal and a sum frequency signal of a product signal of an input signal input into an input terminal and one of the mutually orthogonal signals in at least one pair in a set of multi-frequency separation frequency pairs to one terminal as a filter output. The second bandpass filter circuit is configured to output one of a difference frequency signal and a sum frequency signal of a product signal of the input signal input into the input terminal and the other of the mutually orthogonal signals in the at least one pair in the set of multi-frequency separation frequency pairs to the other output terminal as a filter output.

The frequency conversion orthogonal decomposition circuit 51 is characterized in that it uses bandpass filtering circuits instead of publicly known low-pass filtering circuits. The reason for this will be described next. In each of the signal 511r and the signal 513r from the first multiplication circuit 511 and the second multiplication circuit 513, constituting the frequency conversion orthogonal decomposition circuit 51, at least two beat frequency signals are generated including a sum frequency signal ($\omega$in+$\omega$j) and a difference frequency signal ($\omega$in−$\omega$j) with a frequency $\omega$in of the signal 50p and a frequency $\omega$i of the multi-frequency separation frequency signal pair 50qIQ. However, in the present invention, the frequencies of these beat frequency signals are not set near zero frequency.

The reasons and advantageous effects are as follows. The first reason is to ensure a high degree of freedom which allows the beat frequency signals to be set as any beat frequency signals within a wide range in order to utilize the remainder phenomenon in which a phase of $2\pi$, which the beat frequency signals essentially have as their phases, is a modulus. The particular advantageous effect achieved by this is that the length of one period of each beat frequency can be shortened, thereby shortening the analysis time. The second reason is to achieve an effect of reducing the influence of the phase noise near the frequency $\omega$in of the input signal and the near-DC noise of transistors. The third reason is that using the parallel addition-type phase discrete continuous measurement circuit described in embodiment 4 reduces white noise, jitter, circuit constant variation, and the like, and therefore a measure for this should be taken.

Next, the multi-frequency supply circuit 3, which is a prerequisite circuit to implement the present invention, will be described. In the multi-frequency supply circuit 3, the one signal $50q$Ii and the other signal $50q$Qi, or the two signals with orthogonal phases, constituting a single signal pair $50q$IQi have the same frequency, the integer i being a suffix for identifying signal pairs i with different pair frequencies. The frequency difference (frequency interval) between frequencies fi and fi+1 of signal pairs $50q$IQi and $50q$IQi+1 with successive suffixes i is such that a set of at most m signal pairs $50q$IQi (i=0, m−1) set at substantially fixed frequency intervals can be simultaneously supplied together in parallel. Here, m can be utilized as an additional number for enhancing the noise tolerance.

This set of multi-frequency separation frequency signal pairs $50q$IQi (i=0, m−1) is simultaneously supplied in parallel. A circuit configured to supply such a set of signal pairs can be easily implemented with conventional techniques for the following reasons. The first reason is that each of the frequencies of the set of signal pairs $50q$IQi (i=0, m−1) is a signal with desired accuracy fixed at one frequency. The second reason is that desired stability defined only within the measurement execution time is enough for the phases of the set of signal pairs $50q$IQi (i=0, m−1). The third reason is that the output amplitude is constant. The fourth reason is that high-speed start performance is not needed.

Next, the operation of the phase check circuit 50 will be described. The following equation is obtained by replacing $\omega$ and $\theta$ in equation (2-1c) described in embodiment 2 with the beat frequency ($\omega$in±$\omega$i) and beat phase ($\theta$in±$\theta$i) generated by the frequency conversion orthogonal decomposition circuit 51.

$$B=[\omega_j \mp (\omega_{in} \pm \omega_i)]t + [\theta_j \mp (\theta_{in} \pm \theta_i)] \quad (5\text{-}1)$$

In equation (5-1), the two double signs in each of the two brackets are not in the same order. These two double signs can be set independently of each other by means of a circuit setting. Equation (5-1) means as follows. Firstly, the value of the right-hand side of equation (5-1) is determined if $\omega$i and $\theta$i are substantially fixed at least during a constant phase measurement time. For this reason, a constant phase discrete continuous check process is possible with the instantaneous phase discrete continuous measurement process of the phase analysis circuit 10. Secondly, as a frequency that determines the first bracket part on the right-hand side of equation (5-1), the frequency wi of the multi-frequency separation frequency signal pair is newly added. This increases the degree of freedom in the setting of this bracket part, thereby making it possible to further effectively utilize the phase remainder phenomenon.

Next, an exemplarily method of utilizing the signal pair $51r$IQi (i=i) output to the output terminal pair $50f$IQi (i=i) of the phase check circuit 50 will be described. A sum signal (II signal+QQ signal) of a squared signal (II signal) of the one signal $51r$Ii (i=i), constituting the signal pair $51r$IQi (i=i), and a squared signal (QQ signal) of the other signal $51r$Qi (i=i), constituting the signal pair $51r$IQi (i=i), can be utilized as a squared signal of an instantaneous value proportional to the amplitude of the input signal.

Embodiment 6

The above-described phase analysis circuit 10 and phase check circuit 50, for example, have been described as circuits which, when obtaining discrete signals and continuous signals interpolating the discrete signals, obtain not arctangent signals but corresponding tangent signals as the continuous signals.

The reason is that arctangent signals will be necessary in the end but using tangent signals will not develop essential errors if the process is at a middle stage, and also using tangent signals can make the circuit simpler, thereby reducing the influence of circuit constant variation.

Arctangent signals are needed in a case of, for example, finding a frequency from the phase difference between two times having a desired time difference since in this case precise frequency signals cannot be generated using tangent signals in a phase subtraction operation.

In embodiment 6, a L-th order approximation arctangent circuit 61 configured to convert continuous signals generated as tangent signals into L-th order arctangent signals will be described using an example utilizing near-zero arctangent circuits 60. First, the configurations between peripheral circuits involved in the case of utilizing the near-zero arctangent circuit 60 and three L-th order approximation arctangent circuits 61 constituting the near-zero arctangent circuit 60 will be described using FIG. 22.

Figure 22:
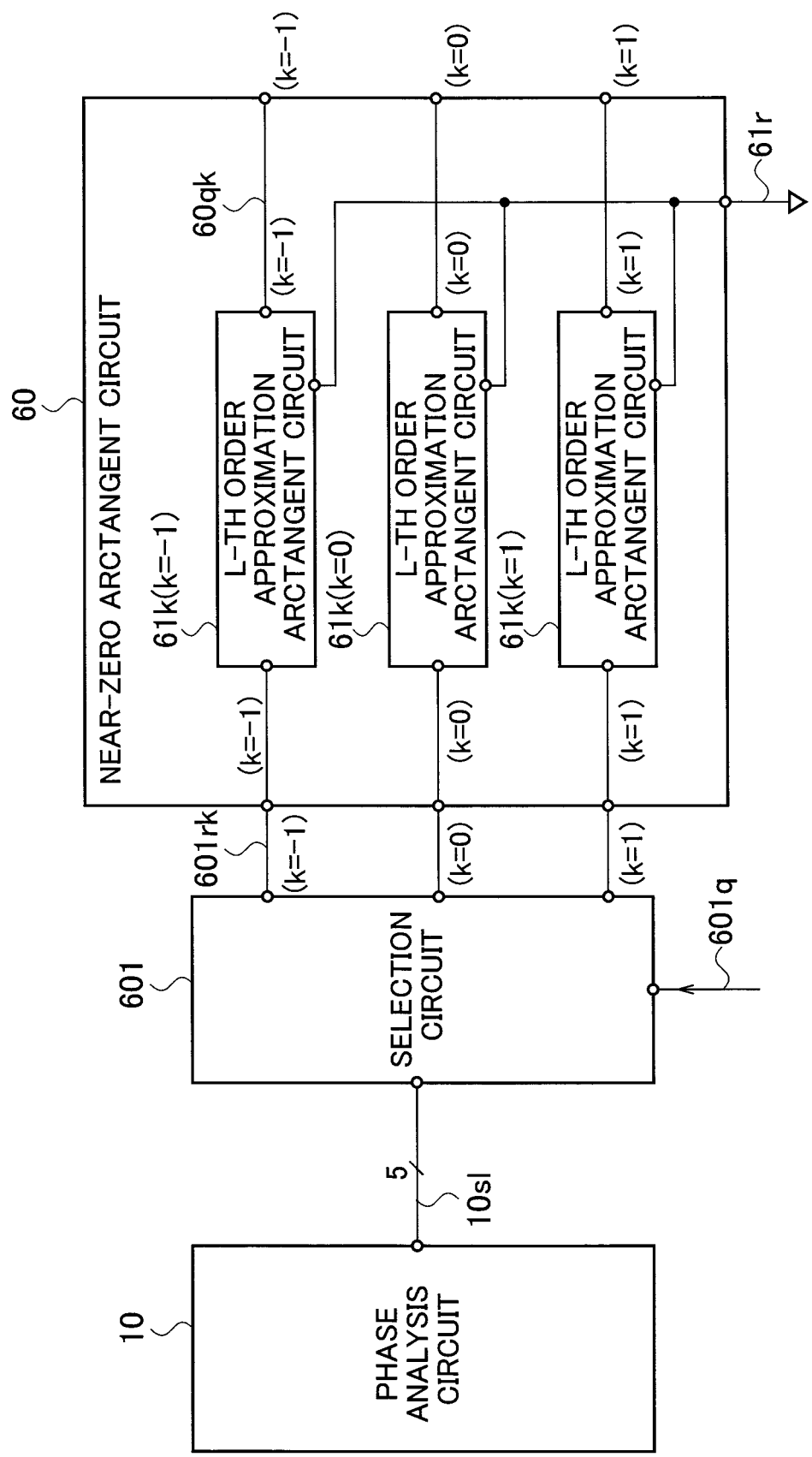
FIG. 22 is a block diagram of a near-zero arctangent circuit in embodiment 5.

The composite circuit illustrated in FIG. 22 includes the phase analysis circuit 10, a selection circuit 601, and the near-zero arctangent circuit 60. The phase analysis circuit 10 is configured to output a set of tangent signals $10sl$ (l=−2, +2) at phase positions 1 centered at the sub-principal value position js. The selection circuit 601 is configured to perform a 5:3 selection process on the set of signals $10sl$ (l=−2, +2) from the phase analysis circuit 10 based on a shift command signal $601q$ indicating one of three values −1, 0, and +1 and output resultant adjacent three tangent signals $601rk$ (k=−1, +1) to the corresponding L-th order approximation arctangent circuits $61k$ (k=−1, +1). The near-zero arctangent circuit 60 is configured to perform three near-zero arctangent processes on the three tangent signals $601rk$ (k=−1, +1) from the selection circuit 601 and output a resultant set of three arctangent signals $60qk$ (k=−1, +1).

The near-zero arctangent circuit 60 includes three L-th order approximation arctangent circuits $61k$ (k=−1, +1) of an autonomous distributed processing type each configured to perform an L-th order near-zero arctangent process on the tangent signal set $601rk$ (k=−1, +1) from the selection circuit 601 based on a base signal $61r$ and output the resultant signal $60qk$ (k=−1, +1).

Next, the configuration of the near-zero arctangent circuit 61, which is the main subject, will be described using FIG. 23. The L-th order approximation arctangent circuit 61 includes an L-stage series-connected circuit and an approximation stop circuit 63. In the L-stage series-connected circuit, the stages are five-terminal circuits (l-th stage approximation circuits 621 (l=1, L)) including five terminals of an input terminal, an output terminal, an approximation base signal output terminal, an approximated signal input terminal, and a base terminal, with a base terminal $62cl$ connected in parallel to those of the others and the remaining four terminals connected as two pairs of terminals in series with those of the others. Here, the approximation order and the number of series-connected stages coincide with each other. Note that an approximation base signal output terminal $62d$ of the l-th order approximation circuit 621 (l=L) is open (NC).

Each L-th order approximation arctangent circuit 61 includes an input terminal $61a$ into to which to input a tangent signal $61p$, an output terminal $61b$ from which to output an L-th order approximated arctangent signal $61q$, and a base terminal $61c$ into which to input the base signal 61r, and also includes an l-th order approximation circuit 62l (l=1), l-th order approximation circuits 62l (l=2, L), and an approximation stop circuit 63, where L is the number of approximation stages. The l-th order approximation circuit 62l (l=1) includes an l-th order approximation term generation circuit 611l (l=1), while each l-th order approximation circuit 621 (l=2, L) includes an l-th order approximation term generation circuit 611l (l=2, L) configured to receive, as an input signal into this circuit, a squared signal of the l-th stage input signal generated by a signal squaring circuit 612.

Figure 24:
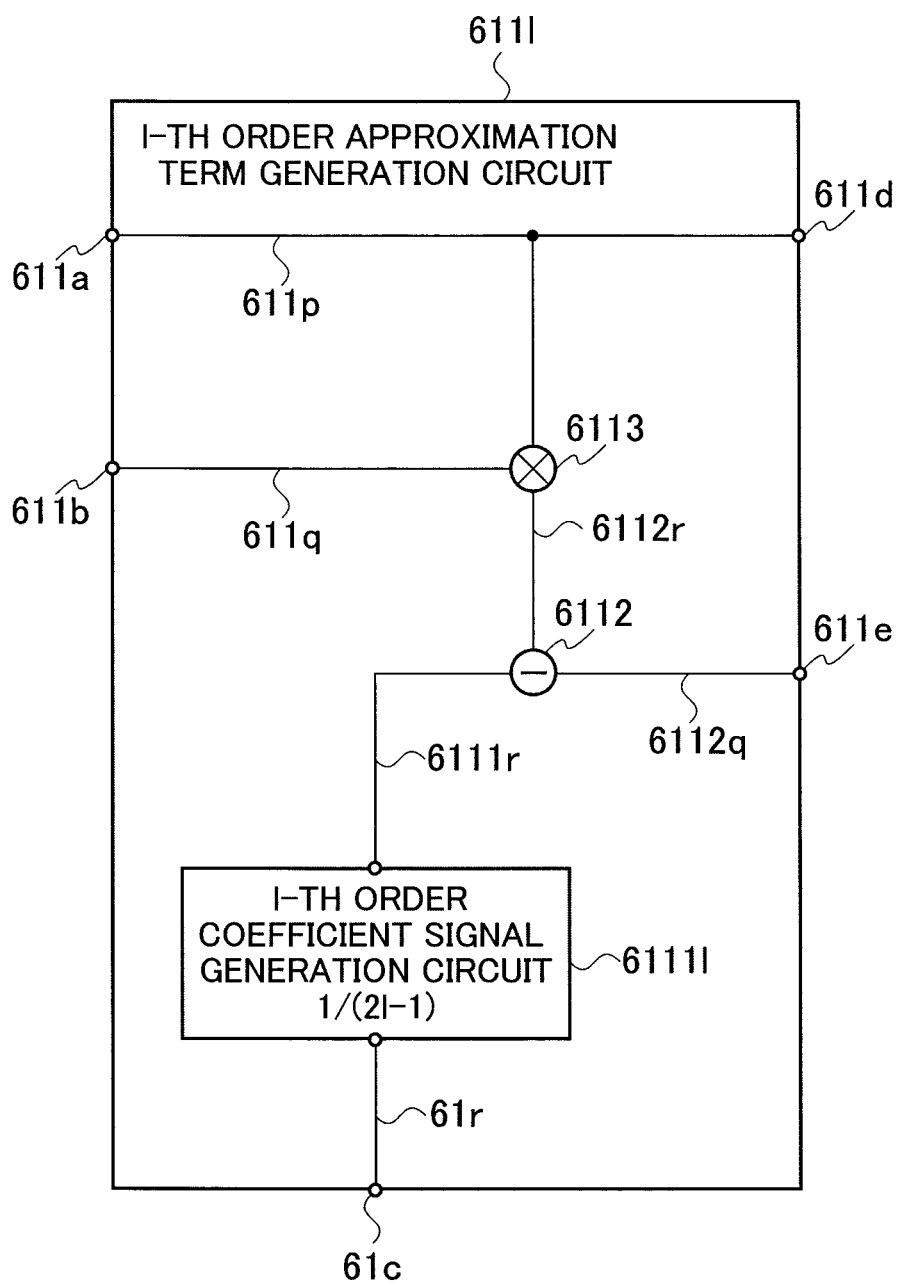
FIG. 24 is a block diagram of an l-th order approximation term generation circuit in embodiment 5.

As illustrated in FIG. 24, each l-th order approximation term generation circuit 611l includes an l-th order coefficient signal generation circuit 6111l, a subtraction circuit 6112, and a first multiplication circuit 6113. The l-th order coefficient signal generation circuit 611l is configured to supply an l-th coefficient signal 6111r to the subtraction circuit 6112 based on the base signal 61r supplied from the terminal 61c, the l-th coefficient signal 6111r being proportional to a quotient "1/(2*1−1)", obtained by dividing 1 by a value obtained by subtracting 1 from a value obtained by multiplying the order "1" by 2.

The subtraction circuit 6112 is configured to perform a subtraction process on the l-th coefficient signal 6111r from the l-th order coefficient signal generation circuit 6111l and a (l+1)-th order approximated signal 6112q from a terminal 611e and output a resultant subtraction result signal 6112r to the first multiplication circuit 6113. The first multiplication circuit 6113 is configured to multiply an l-th stage input signal 611p from a terminal 611a by the subtraction result signal 6112r from the subtraction circuit 6112 and output a resultant approximation result signal 6113r to a terminal 611b.

The l-th stage input signal 611p or a squared signal 613rl is output to an approximation base signal output terminal 611d. The signal squaring circuit 612 includes a second multiplication circuit 613 configured to multiply the input signal supplied to one input terminal of the multiplication circuit by the input signal supplied to the other input terminal of the multiplication circuit, and output the resultant squared signal to the terminal 611a of the l-th stage l-th order approximation term generation circuit 611l.

The approximation stop circuit 63 is configured to supply the base signal 61r from a terminal 61c to a terminal 62bL of the L-th stage l-th order approximation circuit 62l (l=L).

Where k=l−1, the terminal 61a is defined also as a terminal 62dk (l=1), the signal 61p is defined also as a signal 62sk (l=1), the terminal 61b is defined also as a terminal 62ek (l=1), and the signal 61q is defined also as a 62tk (l=1), each l-th order approximation circuit 62l (l=1, L) performs an l-th approximation process on the signal 62sk (l=1, L) supplied from the terminal 62dk (l=1, L) to a terminal 62al (l=1, L) and a signal 62tl (l=1, L) supplied to a terminal 62el (l=1, L), outputs a resultant signal 62ql (l=1, L) from the terminal 62bl (l=1, L) to the terminal 62ek (l=1, L), outputs a signal 62sl (l=1, L) to a terminal 62dl (l=1, L), includes the terminal 62cl (l=1, L) connected to the terminal 61c, and treats the 62tl (l=1, L) as the same signal as the signal 61r. The approximation stop circuit 63 outputs the base signal 61r from the terminal 61c through a terminal 63e and a terminal 63c.

Note that the signal 61r supplied to the terminal 61c is the same as the global base signal 1p.

The l-th order approximation circuit 62l (l=1) includes an l-th order approximation term generation circuit 611l (l=1) configured to perform an l-th order approximation term generation process on the signal 61p supplied to the terminal 61a and a signal 611tl (which is the same as 62ql) supplied to a terminal 611el, output a resultant signal 611ql from a terminal 611bl to the terminal 62ek, and output a signal 611sl to the corresponding terminal 62dl.

Each l-th order approximation circuit 62l (l=2, L) includes a signal squaring circuit 612l (l=2, L) and an l-th order approximation term generation circuit 611l (l=2, L). The signal squaring circuit 612l (l=2, L) includes a multiplication circuit 613l configured to multiply a signal 613pl supplied to a terminal 613al from the terminal 62al through a terminal 612al by a signal 613ql supplied to a terminal 613bl from the terminal 62al through the terminal 612al, and output the resultant signal 613rl to a terminal 611al from a terminal 613cl through a terminal 612bl.

Each l-th order approximation term generation circuit 611l (l=2, L) outputs a signal 611ql obtained by applying an l-th order approximation term generation effect to a signal 611pl supplied from the terminal 612bl to the terminal 611al and a signal 611tl supplied from the corresponding terminal 62el to the corresponding terminal 611el (also referred to as the (l+1)-th order approximated signal), from the corresponding terminal 611bl to the corresponding terminal 62bl, and also outputs a signal 611sl to the corresponding terminal 62dl.

The operation will be described next. When x is the signal 61p supplied to the input terminal 61a of a fifth-order approximation arctangent circuit 61, whose L value is 5, and y is the signal 61q output from the output terminal 61b, the relation between x and y can be expressed by the following equation.

$$y \cong x\left[\left(1 - x^2\left(\frac{1}{3} - x^2\left(\frac{1}{5} - x^2\left(\frac{1}{7} - x^2\frac{1}{9}\right)\right)\right)\right)\right] \tag{6-1}$$

Figure 23:
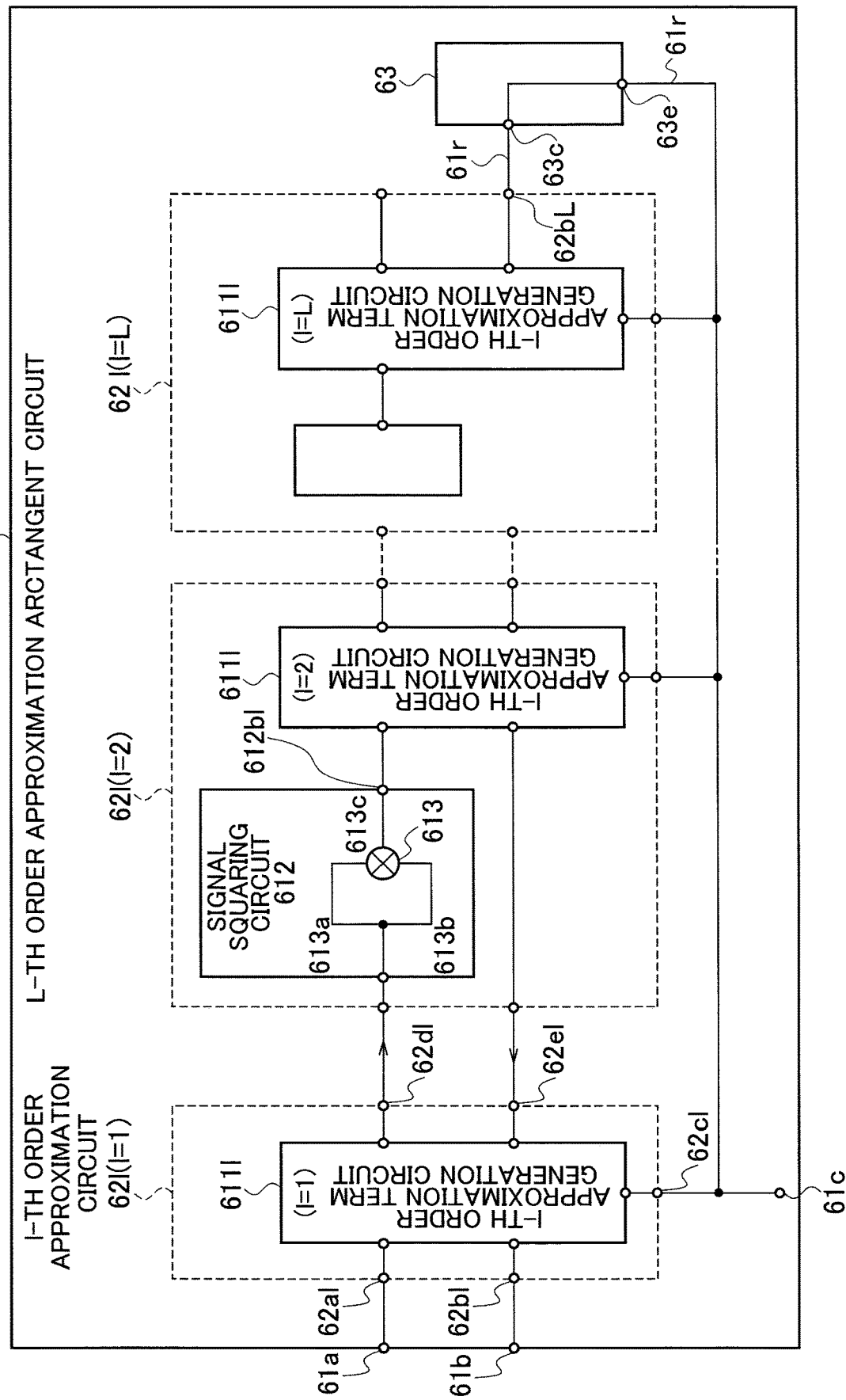
FIG. 23 is a block diagram of an L-th order approximation arctangent circuit in embodiment 5.

Although the above equation is for fifth-order approximation, the content of the circuit described using FIG. 23 is for L-th order approximation in general. This circuit is characterized by deforming Gregory's arctangent power series expansion formula such that the approximated signals of subsequent series-connected circuits 62l do not directly affect the precision of the arctangent conversion signal. Also, this circuit works well when near-zero phases are problematic as in the case where a phase of 2π is divided by n by phase separation frequency signals. The present invention assumes the division number n to be 16 or larger. If n=32, the same precision can be achieved with a lower order.

Next, simulation results will be described using FIG. 25. The horizontal axis represents the value of the tangent signal input into the terminal 61a of an L-th order approximation arctangent circuit 61. Only a region in which the sign of the tangent signal is positive is plotted, while assuming that the tangent signal is 1 at 45° on the horizontal axis. The vertical axis indicates the error in ppm of the value of an L-th order approximated arctangent signal y with respect to the value of an accurate arctangent signal. Meanwhile, the solid line plots a case of fifth-order approximation while the dotted line plots a case of fourth-order approximation.

Figure 25:
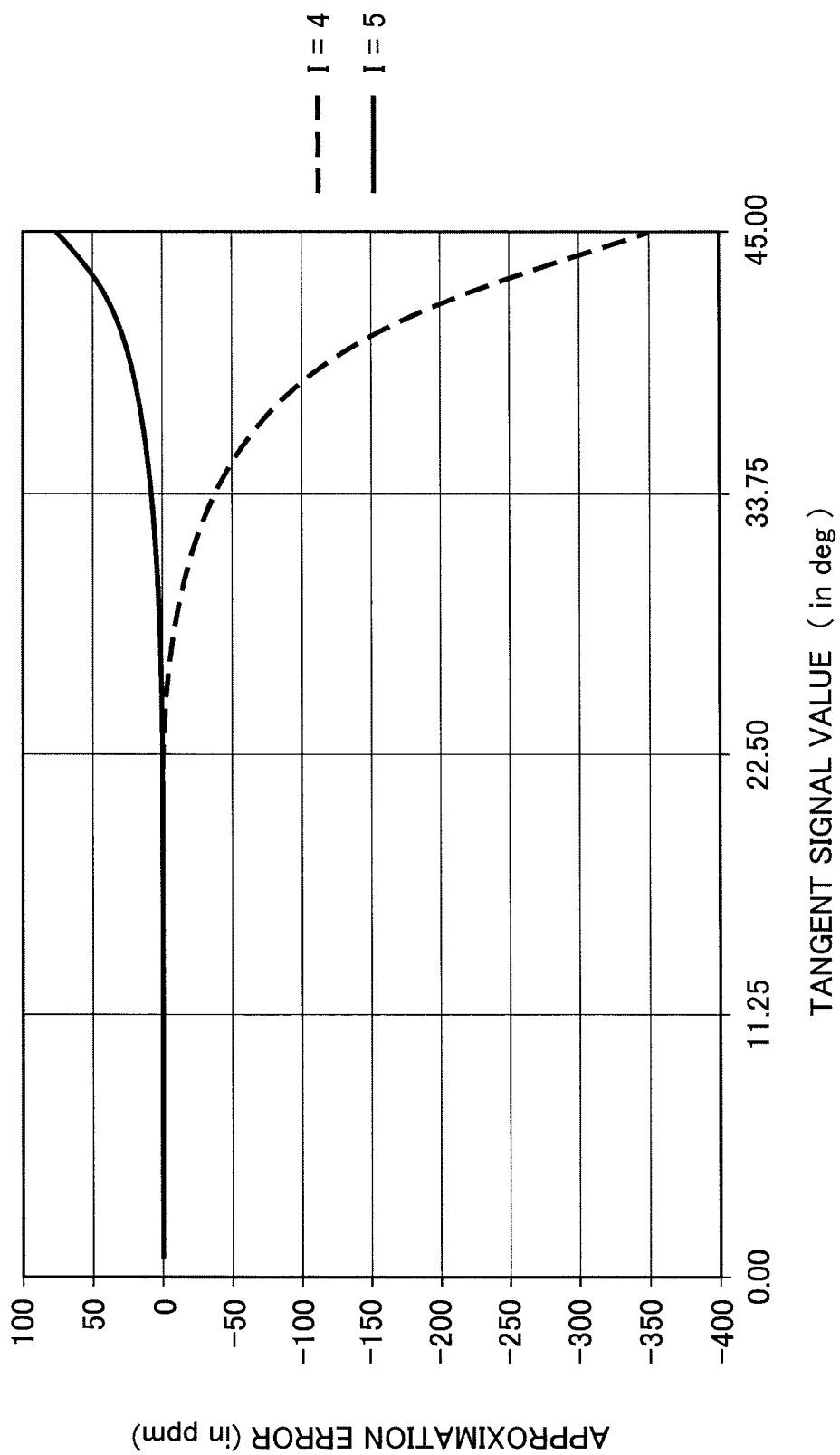
FIG. 25 is a diagram of the result of an error simulation on L-th order approximation output signals in embodiment 5.

What is characteristic in FIG. 25 is that, even in the case of using the multi-phase separation frequency signal pairs dividing a phase of 2π by 16 (n=16), overrange is present with sufficient precision across the range of three adjacent separation positions (j−1), j, and (j+1) illustrated in FIG. 4. This presence of overrange can be utilized to enhance precision in the lending-borrowing process and the like between the discrete analysis values and the continuous tangent values in the subtraction of the two phases at two different times.

INDUSTRIAL APPLICABILITY

The present invention is applicable to phase analysis circuits and phase check circuits.

EXPLANATION OF SIGNS 2 multi-phase supply circuit
3 multi-frequency supply circuit
10 phase analysis circuit
11 phase discrete continuous measurement circuit
20 parallel phase shift circuit
21 IQ signal phase shift circuit
30 phase discrete continuous measurement circuit
31 tangent circuit
32 tangent generation circuit
33 sub-principal value detection circuit
34 sub-quotient position detection circuit
37 main quadrant position detection circuit
38 smallest position detection circuit
39 tangent signal output circuit
40 IQ addition phase measurement circuit
41 IQ signal addition circuit
50 phase check circuit
51 frequency conversion orthogonal decomposition circuit
60 near-zero arctangent circuit
61 L-th order approximation arctangent circuit

The invention claimed is:

1. A phase analysis circuit comprising:
a parallel phase shift circuit configured to perform a phase shift process in parallel on an input signal pair including a first I signal and a first Q signal orthogonal to the first I signal, based on a phase difference among a plurality of n multi-phase separation frequency signal pairs, the separation frequency pairs including a set of second I signals and a set of second Q signals, each second Q signal being orthogonal to one of the second I signals, to thereby generate a set of n phase-shifted orthogonal signal pairs, the n phase-shifted orthogonal pairs including a set of third I signals and a set of third Q signals, each third Q signal being orthogonal to one of the third I signals, each of the set of second I signals and the set of second Q signals having a same frequency, a same amplitude, and a phase difference obtained by dividing a phase of $2\pi$ by n; and
a phase discrete continuous measurement circuit configured to, based on the n phase-shifted orthogonal signal pairs from the parallel phase shift circuit, generate a set of discrete signals being n discrete values and generate a set of continuous tangent signals being a set of a desired number k of signals interpolating the set of discrete signals, the desired number k being smaller than or equal to n.

2. The phase analysis circuit according to claim 1, wherein
the parallel phase shift circuit includes n IQ signal phase shift circuits, each IQ signal phase shift circuit being configured to perform a phase shift process on the input signal pair and a j-th pair among the n multi-phase separation frequency signal pairs, and output the resultant set of n phase-shifted orthogonal signal pairs,
the n IQ signal phase shift circuits each include a first multiplication circuit configured to generate a first product signal by multiplying the first I signal by a corresponding one of the second I signals,
a second multiplication circuit configured to generate a second product signal by multiplying the first Q signal by a corresponding one of the second Q signals,
a first addition-subtraction circuit configured to perform one of addition and subtraction on the first product signal and the second product signal, and output a resultant one phase-shifted orthogonal signal to one output terminal,
a third multiplication circuit configured to generate a third product signal by multiplying the first I signal by the second Q signal,
a fourth multiplication circuit configured to generate a fourth product signal by multiplying the first Q signal by the second I signal, and
a second addition-subtraction circuit configured to perform the other of addition and subtraction on the third product signal and the fourth product signal, and output a resultant other phase-shifted orthogonal signal to the other output terminal.

3. The phase analysis circuit according to claim 1, wherein the phase discrete continuous measurement circuit includes
a tangent circuit including n tangent generation circuits configured to generate a set of n tangent signals at positions j of the set of n phase-shifted orthogonal signal pairs based on the set of the third I signals and the set of the third Q signals in the n phase-shifted orthogonal signal pairs, and
a sub-principal value detection circuit configured to generate the set of n discrete signals at the positions j of the set of n phase-shifted orthogonal signal pairs based on the set of n phase-shifted orthogonal signal pairs and the set of n tangent signals, and generate the set of continuous tangent signals sk (k =l1,l2) based on the set of n tangent signals and the set of n discrete signals, where k is a desired number of continuous tangent signals to be output equal to or smaller than n, l1=(1−k)/2, and l2=(k−1)/2.

4. The phase analysis circuit according to claim 3, wherein the tangent generation circuits each include
an analog division circuit configured to divide, by one signal among a corresponding one of the third I signals and a corresponding one of the third Q signals supplied, the other signal among the third I signal and the third Q signal, and output a resultant quotient signal, and
a division range control circuit configured to summate a first squared signal obtained by squaring the one signal among a corresponding one of the third I signals and a corresponding one of the third Q signals supplied and a second squared signal obtained by squaring the other signal among the third I signal and the third Q signal to thereby obtain a resultant third squared signal, and output the quotient signal if a value of the first squared signal is larger than or equal to a value obtained by applying a first threshold to the third squared value, whereas outputting a signal proportional to a second threshold if the value of the first squared signal is smaller than the value obtained by applying the first threshold to the third squared value.

5. The phase analysis circuit according to claim 3, wherein the sub-principal value detection circuit includes
a sub-quotient position detection circuit configured to detect a sub-quotient position located where an absolute value of one tangent signal in the set of tangent signals is a smallest value, based on the set of phase-shifted orthogonal signal pairs and the set of tangent signals, and output sub-quotient position signals as the resultant set of discrete signals, and
- a tangent signal output circuit configured to generate the set of continuous tangent signals based on the set of tangent signals and the set of discrete signals from the sub-quotient position detection circuit, and output the set of continuous tangent signals.

6. The phase analysis circuit according to claim 5, wherein the sub-quotient position detection circuit includes n main quadrant position detection circuits each configured to output a main quadrant position detection signal of 1 if detecting a first state and a second state, whereas outputting a main quadrant position detection signal of 0 if failing to detect at least one of the first state and the second state, the first state being a state in which a sign of one input signal in a corresponding one of the phase-shifted orthogonal signal pairs is positive, the second state being a state in which an amplitude of the one input signal is larger than an amplitude of the other input signal.

7. The phase analysis circuit according to claim 5, wherein
- the sub-quotient position detection circuit includes n smallest position detection circuits,
- the n smallest position detection circuits each include
  - a smallest amplitude detection circuit configured to output a smallest position signal of 1 if, among a first tangent signal supplied to a first terminal k1, a second tangent signal supplied to a second terminal k2, and a third tangent signal supplied to a third terminal k3, an absolute value of an amplitude of the second tangent signal or a squared value of the absolute value is the smallest, whereas outputting a smallest position signal of 0 if the absolute value or the squared value is not the smallest, where a smallest position detection position is j, k1=mod(j−1, n), k2=j, and k3=mod(j +1, n),
  - a different sign detection circuit configured to output a different sign detection signal of 1 if a sign of the signal supplied to the first terminal and a sign of the signal supplied to the third terminal are different, whereas outputting a different sign detection signal of 0 if the signals are same, and
  - a multiplication circuit configured to multiply the smallest position signal and the different sign detection signal and output the resultant sub-quotient position signal.

8. The phase analysis circuit according to claim 5, wherein the tangent signal output circuit includes
- n output control circuits configured to perform an output control process on the set of tangent signals based on the sub-quotient position signals and output resultant n sets of selected tangent signals jk (j=0, n−1), each of the n output control circuits performing the output control process as a process allowing output of (k−1)/2 signals for each of phase positions defined by a modulus of n and located on opposite sides of a phase position at which a corresponding one of the sub-quotient position signals is js, and
- k output addition circuits each configured to designate k, add together the n selected tangent signals supplied for k, and output a resultant addition signal.

9. The phase analysis circuit according to claim 3, further comprising an L-th order approximation arctangent circuit configured to convert the tangent signals into l-th order arctangent signals (1 is the number of approximation stages) and including an l-th order approximation circuit (l=1), l-th order approximation circuits (l=2, L), and an approximation stop circuit,
- wherein the l-th order approximation circuit (l=1) includes an l-th order approximation term generation circuit (l=1),
- the l-th order approximation circuits (l=2, L) include l-th order approximation term generation circuits 1(l=2, L) each configured to receive, as an input signal into the l-th order approximation term generation circuit 1 (l=2, L), a squared signal of an l-th stage input signal generated by a signal squaring circuit,
- the l-th order approximation term generation circuits 1 each include
  - an l-th order coefficient signal generation circuit configured to output an l-th coefficient signal based on a base signal, the 1-th coefficient signal being proportional to a quotient "1/(2 * 1−1)", obtained by dividing 1 by a value obtained by subtracting 1 from a value obtained by multiplying the stage number 1 by 2,
  - a subtraction circuit configured to perform a subtraction process on the l-th coefficient signal and a (l+1)-th order approximated signal and output a resultant subtraction result signal, and
  - a first multiplication circuit configured to multiply the l-th stage input signal by the subtraction result signal and output a resultant approximation result signal,
- the l-stage input signal is output also to an approximation base signal output terminal,
- the signal squaring circuit includes a second multiplication circuit configured to multiply an input signal supplied to one input terminal of the multiplication circuit by the input signal supplied to the other input terminal of the multiplication circuit, and output the resultant squared signal, and
- the approximation stop circuit supplies the base signal to an approximated signal input terminal of the l-th order approximation circuit at the l-th stage (l=L).

10. The phase analysis circuit according to claim 1, further comprising an IQ signal addition circuit,
- wherein the IQ signal addition circuit includes
  - an I signal addition circuit including n first addition-subtraction circuits configured to output one of a set of addition signals and a set of subtraction signals of a set of n first difference signals and a set of third difference signals, the set of n first difference signals being difference signals at positions shifted by 180° from each other among the set of I signals before addition in the set of n phase-shifted orthogonal signal pairs, the set of third difference signals being signals at positions shifted from the set of first difference signals by 90° , and
  - a Q signal addition circuit including n second addition-subtraction circuits configured to output the other of a set of addition signals and a set of subtraction signals of a set of n second difference signals and a set of fourth difference signals, the set of n second difference signals being difference signals at positions shifted by 180° from each other among the set of Q signals before addition in the set of n phase-shifted orthogonal signal pairs, the set of fourth difference signals being signals at positions shifted from the set of second difference signals by 90° .

11. The phase analysis circuit according to claim 1, further comprising a frequency conversion orthogonal decomposition circuit, wherein the frequency conversion orthogonal decomposition circuit includes a first bandpass filter circuit configured to output one of a difference frequency signal and a sum frequency signal of a product signal of an input signal input into an input terminal and one of mutually orthogonal signals in at least one pair in a set of multi-frequency separation frequency pairs, to one input terminal of the parallel phase shift circuit, and a second bandpass filter circuit configured to output one of a difference frequency signal and a sum frequency signal of a product signal of the input signal and the other of the mutually orthogonal signals in the at least one pair in the set of multi-frequency separation frequency pairs, to the other input terminal of the parallel phase shift circuit.

\* \* \* \* \*